(12) United States Patent
Lee et al.

(10) Patent No.: US 8,637,989 B2
(45) Date of Patent: Jan. 28, 2014

(54) SEMICONDUCTOR CHIP HAVING VIA ELECTRODES AND STACKED SEMICONDUCTOR CHIPS INTERCONNECTED BY THE VIA ELECTRODES

(75) Inventors: Ho-jin Lee, Seoul (KR); Hyun-soo Chung, Hwaseong-si (KR); Chang-seong Jeon, Hwaseong-si (KR); Sang-sick Park, Hwaseong-si (KR); Jae-hyun Phee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/569,653

(22) Filed: Aug. 8, 2012

(65) Prior Publication Data
US 2012/0299194 A1    Nov. 29, 2012

Related U.S. Application Data

(63) Continuation of application No. 12/543,347, filed on Aug. 18, 2009, now abandoned.

(30) Foreign Application Priority Data

Oct. 24, 2008  (KR) .................. 10-2008-0104986

(51) Int. Cl.
*H01L 23/48* (2006.01)

(52) U.S. Cl.
USPC ..... 257/773; 257/774; 257/777; 257/E23.141

(58) Field of Classification Search
USPC .......... 257/777, 773, 774, 778, 775, E23.141
See application file for complete search history.

(56) References Cited

U.S. PATENT DOCUMENTS

| | | | | |
|---|---|---|---|---|
| 7,129,112 | B2* | 10/2006 | Matsuo | 438/107 |
| 7,214,615 | B2* | 5/2007 | Miyazawa | 438/667 |
| 7,886,437 | B2* | 2/2011 | Nashner et al. | 29/852 |
| 2006/0073637 | A1* | 4/2006 | Yokoyama et al. | 438/109 |
| 2008/0258309 | A1* | 10/2008 | Chiou et al. | 257/774 |

* cited by examiner

*Primary Examiner* — Michael Trinh
(74) *Attorney, Agent, or Firm* — F. Chau & Associates, LLC

(57) ABSTRACT

A semiconductor device includes a semiconductor substrate and a via electrode. The via electrode has a first portion on the substrate and extends towards the substrate and has a plurality of spikes that extends from the first portion into the substrate, each of the spikes being spaced apart form one another.

5 Claims, 25 Drawing Sheets

SEMICONDUCTOR CHIP HAVING VIA ELECTRODES AND STACKED SEMICONDUCTOR CHIPS INTERCONNECTED BY THE VIA ELECTRODES

CROSS-REFERENCE TO RELATED APPLICATION

This application is a continuation application of U.S. application Ser. No. 12/543,347 filed Aug. 18, 2009, now abandoned, which claims priority to and the benefit of Korean Patent Application No. 10-2008-0104986, filed on Oct. 24, 2008, in the Korean Intellectual Property Office, the disclosures of which are each hereby incorporated by reference herein in their entireties.

BACKGROUND

1. Technical Field

The present disclosure relates to semiconductor devices, and, more particularly, to via electrodes for semiconductor chips and stacked semiconductor chips interconnected by the via electrodes.

2. Discussion of Related Art

As electronic devices become smaller and smaller the use of wire and solder balls are becoming less and less common. In recent years the semiconductor industry has been striving to cost effectively produce reliable electrically connectable stacks of semiconductor wafers while minimizing manufacturing difficulties.

In the manufacturing of integrated circuit (IC) devices, components and metal circuit lines separated by dielectric substrate material, such as silicon oxide, are typically connected through holes or "vias" which have been etched through the dielectric substrate material. The through silicon via (TSV) is cleaned of photoresist and etch residues and then filled with conductive metal to provide an electrical connection from one side of the substrate to the other.

However, one difficulty that can affect interconnect performance and reliability is when the TSVs are not free of cleaning residue prior to being filled. The removal of such cleaning residue, often called "via veils", can become difficult because of etch chemistries and may involve the costly and delicate use of aggressive wet chemical solvents to insure clean TSVs that provide reliable electrode connection paths when filled. Strides have been made to minimize this difficulty through the use of a dry de-veiling process rather than the aggressive wet solvent process.

Further, wafer stack packaging (WSP) technology using a TSV as a through hole electrode for multiple layer packaging continues to be used in an attempt to reduce package thickness, size and interconnection length between semiconductor chips/dies.

However, because integration density of semiconductor chips is increasing, the diameters of via holes for forming a conventional TSV are getting smaller. Because an aspect ratio of the hole then becomes very high, voids may be developed in the via hole during filling the hole with conductive material for forming TSV electrode. Such voids precipitate the inducing of a connection failure from one side of the chip to the other, or between dies in the stack.

In an attempt to avoid connection failures, U.S. Patent Publication No. 2008/0092378 proposes a method for manufacturing an electroconductive material-filled through hole substrate of which the front side and back side are electrically conductive to each other through an electroconductive material filled into the through holes. An electroconductive base layer is formed on one side of a core substrate having through holes. The through holes are filled with an electroconductive copper material by electroplating using the electroconductive base layer as a seed layer. However, the disclosure does not address the problem of potential voids in TSVs. Holes in the substrate are merely filled and the substrate stripped off and polished until the electroconductive material in the holes is exposed.

In a further attempt to address connections involved in the stacking of semiconductor chips, U.S. Pat. No. 6,809,421 proposes a multichip semiconductor device having a stack of chips each having a semiconductor substrate which has a surface on which circuit components are formed. While providing for metal plugs as electrodes through the respective substrates, the disclosure also does not address the problem of potential voids in TSVs. Holes in the substrate are merely filled and the substrate stripped off and polished until the metal plug is exposed.

Therefore, a need still exists for approaches for providing effective TSVs, particularly those that allow for firm electrical connection between components and circuits separated by dielectric layers, and those that avoid voids in via electrodes that can induce connection failures between one side of a semiconductor chip to the other side, or between chips in a stack of chips.

SUMMARY

In accordance with an exemplary embodiment of the present invention a semiconductor device is provided having a semiconductor substrate and a via electrode. The via electrode includes a first portion on the substrate and extends towards the substrate, and a plurality of spikes that extends from the first portion into the substrate, each of the spikes being spaced apart form one another.

A conductive pad may be on the substrate and contacts the first portion.

The spikes may be cylindrical in shape.

The spikes may be tapered from a smaller diameter at their ends distal from the first portion as compared with a diameter of their ends proximal to the first portion.

The first portion may further include a protrusion that extends beyond a surface of the conductive pad distal from the semiconductor substrate.

The first portion may be cylindrical and tapered, with a smaller diameter at a first portion end distal from the conductive pad as compared with a first portion end proximal to the conductive pad.

A dielectric layer may be on the substrate, the conductive pad being on the dielectric layer.

The first portion may extend through the dielectric layer into the substrate.

The first portion may extend through the dielectric layer without extending into the substrate.

The spikes may extend beyond a surface of the substrate distal from the conductive pad.

The surface of the substrate distal from the conductive pad may include a recess portion exposing a portion of the spikes.

A redistribution line may be connected to the protrusion, the redistribution line extending in a direction substantially parallel with a surface of the semiconductor substrate.

The spikes that extend beyond the surface of the substrate distal from the conductive pad may be connected to a protrusion of another via electrode in another semiconductor device.

The another semiconductor device may be connected to a module substrate having conductive bumps by spikes of the via electrode of the another semiconductor device penetrating the conductive bumps.

The semiconductor device may be connected to a module substrate having conductive bumps by the protrusion interfacing with the conductive bumps.

The spikes that extend beyond the bottom surface of the substrate may be connected to a redistribution line connected to a protrusion of another via electrode in another semiconductor device.

In accordance with an exemplary embodiment of the present invention a semiconductor device is provided having a substrate, a first dielectric layer on the substrate, a conductive pad connected to an interconnection pattern in the first dielectric layer, and a via electrode having a first portion and second portion in the substrate, the first portion being a cylindrical body and the second portion being a plurality of spikes that extend from the first portion, each of the spikes being spaced apart from one another.

The interconnection pattern may include a conductive line and a conductive plug.

The via electrode may be connected to the interconnection pattern by a conductive plug or a conductive line.

The semiconductor device may further include a second dielectric layer including a circuit layer between the substrate and the first dielectric layer. The first portion may extend through the second dielectric layer.

The first dielectric layer may include an interlayer metal dielectric layer and the second dielectric layer may include an interlayer dielectric layer.

In accordance with an exemplary embodiment of the present invention a method of forming a semiconductor device is provided. A substrate is formed. A dielectric layer is formed on the substrate. A conductive pad is formed on the dielectric layer. A via trench is formed through the conductive pad, the dielectric layer, and a portion of the substrate. A plurality of spike trenches is formed through a bottom surface of the via trench and extend into the substrate, each of the spike trenches being spaced apart from each other. A via electrode is formed by filling the spike trenches with a first conductive material and filling the via trench with a second conductive material.

An insulation layer may be formed on the surfaces of the spike trenches and the via trench.

The first conductive material may be the same as the second conductive material.

The first conductive material may include one of W, Al, or polysilicon.

The walls of the spike trenches and the via trench may be lined with a barrier metal prior to filling with the first conductive material and the second conductive material.

The barrier metal may be one of, or a combination of, Ti, Ta, TiN or TaN.

The second conductive material may be Cu.

A protrusion may be formed on the conductive pad by overfilling the via trench.

Portions of the via electrode may be exposed by removing portions of the substrate opposite the conductive pad.

In accordance with an exemplary embodiment of the present invention method of forming a semiconductor device is provided. A substrate is formed. A via trench is formed into the substrate. A plurality of spike trenches is formed through a bottom surface of the via trench, further extending into the substrate, each of the spike trenches being spaced apart from each other. A via electrode is formed by filling the spike trenches and the via trench with a conductive material. The top surface of the via electrode and the substrate are planarized. A first dielectric layer is formed on the planarized surface of the substrate and the via electrode. An interconnection pattern is formed in the first dielectric layer. A conductive pad is formed on the first dielectric layer.

An insulation layer may be formed on the surfaces of the spike trenches and the via trench.

The method may further include a second dielectric layer including a circuit layer between the substrate and the first dielectric layer. The via electrode may extend through the second dielectric layer.

In accordance with an exemplary embodiment of the present invention a method of forming a semiconductor device is provided. A substrate is formed. A plurality of spike trenches are formed in the substrate. The spike trenches are filled with a first conductive material. A dielectric layer is formed on the substrate. A conductive pad is formed on the dielectric layer. A via trench is formed through the conductive pad and the dielectric layer. The via trench is filled with a second conductive material.

A protrusion may be formed on the conductive pad by overfilling the via trench.

The first conductive material may include one of W, Al, or polysilicon.

The second conductive material may be Cu.

In accordance with an exemplary embodiment of the present invention a method of forming a semiconductor chip having a via electrode is provided. A chip substrate having a chip front surface separated from a chip back surface is provided. A pair of via trenches is formed between the chip front surface and the chip back surface, a first trench of the pair extending partially into the chip substrate, a second trench of the pair extending from the first trench further into the chip substrate, the first trench having a larger diameter than the second trench. The pair of via trenches is filled with electrically conductive material to form the via electrode.

A dielectric layer may be formed on the chip front surface. A conductive pad may be formed on the dielectric layer. A protrusion may be formed on the conductive pad, the protrusion being electrically coupled to the via electrode.

A redistribution circuit line may be electrically coupled to the protrusion such that via electrode is electrically connectable to other devices.

The pair of via trenches may extend from the chip front surface to the chip back surface.

At least one of the pair of via trenches may taper in diameter from the chip front surface toward the chip back surface.

The pair of via trenches may be formed by forming the second trench to have a plurality of trench spikes that extend from the first trench.

The trench spikes may extend beyond the chip back surface.

In accordance with an exemplary embodiment of the present invention method of stacking a pair of semiconductor chips having via electrodes is provided. Each of the pair of semiconductor chips is formed by: providing a chip substrate having a chip front surface separated from a chip back surface, forming a pair of via trenches between the chip front surface and the chip back surface, a first trench of the pair extending partially into the chip substrate, a second trench of the pair extending from the first trench further into the chip substrate, the first trench having a larger diameter than the second trench, the second trench having a plurality of trench spikes that extend from the first trench beyond the chip back surface, filling the pair of via trenches with electrically conductive material to provide a via electrode, forming a dielectric layer on the chip front surface, forming a conductive pad on the dielectric layer, forming a protrusion on the conductive pad, the protrusion being electrically coupled to the via electrode, and forming a conductive bump on the protrusion of one of the pair. An adhesive is applied on the dielectric layer and the conductive pad of the one of the pair for adhering the dielectric layer and the conductive pad of the one of the pair to the chip back surface of the other of the pair. The pair of semiconductor chips is pressed together such that the spikes of the other of the pair penetrate the conductive bump of the one of the pair and the adhesive contacts the chip back surface of the other of the pair.

In accordance with an exemplary embodiment of the present invention an electronic subsystem including a host coupled to a memory system having a memory controller coupled to a memory device is provided. The memory device includes a conductive pad on a semiconductor substrate and a via electrode. The via electrode includes a first portion contacting the conductive pad and extending towards the substrate and a plurality of spikes that extend from the first portion further into the substrate.

The host may be a mobile device or a processing device having a processor.

The electronic subsystem may further include a wireless interface for communicating with a cellular device.

The electronic subsystem may further include a connector for removably connecting to a host system. The host system may be one of a personal computer, notebook computer, hand held computing device, camera, or audio reproducing device.

The wireless interface may communicate using a communication interface protocol of a third generation communication system, including one of code division multiple access (CDMA), global system for mobile communications (GSM), north American digital cellular (NADC), extended-time division multiple access (E-TDMA), wide band code division multiple access (WCDMA), or CDMA2000.

In accordance with an exemplary embodiment of the present invention an electronic subsystem is provided having a printed circuit board supporting a memory unit, a device interface unit and an electrical connector, the memory unit having a memory that has memory cells arranged on the printed circuit board, the device interface unit being electrically connected to the memory unit and to the electrical connector through the printed circuit board, at least one of the memory unit and device interface unit comprising a semiconductor device. The semiconductor device includes a conductive pad on a semiconductor substrate and a via electrode. The via electrode includes a first portion contacting the conductive pad and extending towards the substrate and a plurality of spikes that extend from the first portion further into the substrate.

BRIEF DESCRIPTION OF THE DRAWINGS

Exemplary embodiments of the present invention will be more clearly understood from the following detailed description taken in conjunction with the following accompanying drawings.

DETAILED DESCRIPTION OF THE EMBODIMENTS

Figure 1A:
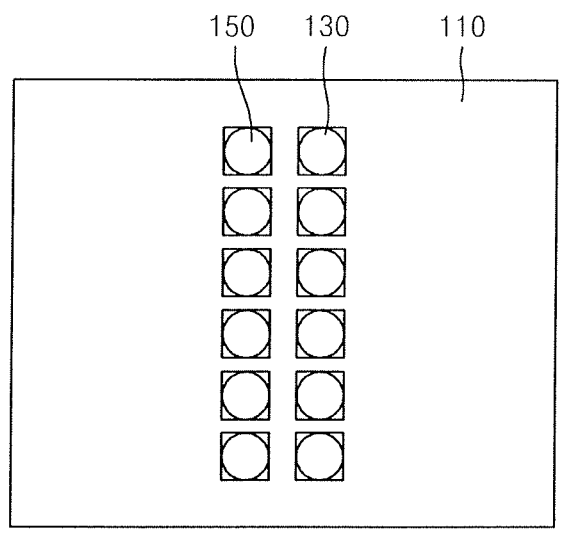
FIG. 1a shows a plan view of a semiconductor chip.

The exemplary embodiments will now be described more fully hereinafter with reference to the accompanying drawings, in which embodiments are shown. These examples, however, may be embodied in many different forms and should not be construed as limited to the embodiments set forth herein. Rather, these embodiments are provided so that this disclosure will be thorough and complete, and will fully convey the scope. In the drawings, the thicknesses of layers and regions are exaggerated for clarity. Like numbers refer to like elements throughout.

It will be understood that when a layer or element is referred to as being "on" another layer or element, it can be directly on the other layer or element, or intervening layers may also be present. Further, it will be understood that when a layer is referred to as being "under" another layer or element, it can be directly under the layer or element, or one or more intervening layers or elements may also be present. In addition, it will be understood that when a layer or an element is referred to as being "between" two layers or elements, it can be the only layer between the two layers or elements, or one or more intervening layers or elements may also be present.

It will be understood that the order in which the steps of each fabrication method according to an exemplary embodiment of the present invention disclosed in this disclosure are performed is not restricted to those set forth herein, unless specifically mentioned otherwise. Accordingly, the order in which the steps of each fabrication method according to an exemplary embodiment of the present invention disclosed in this disclosure are performed can be varied.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "vertical" refers to a direction that is substantially orthogonal to a horizontal direction.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the exemplary embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
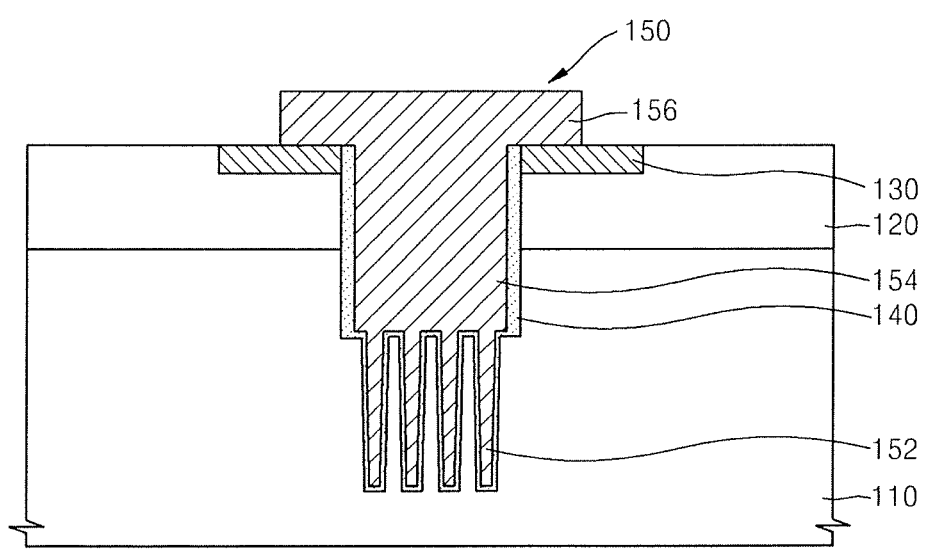
FIG. 1b is a cross sectional view showing a portion of the semiconductor chip.
Figure 1C:
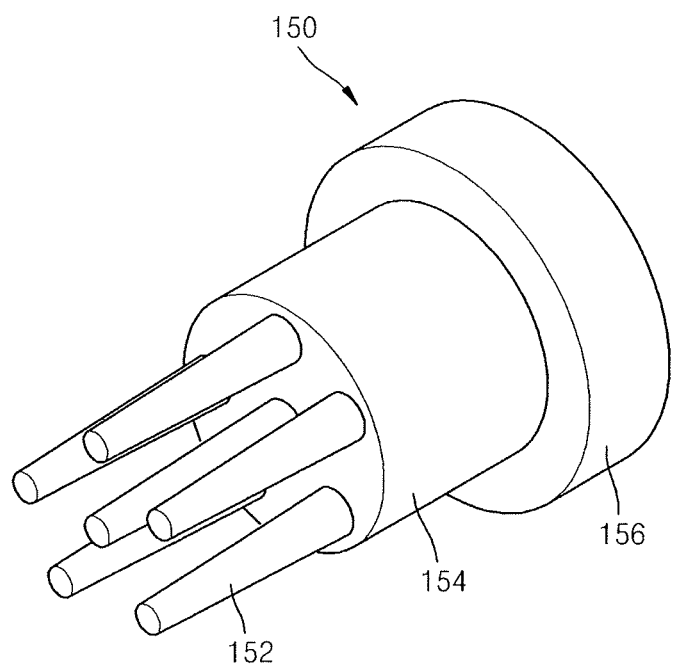
FIG. 1c is a perspective view showing via electrode 150 of the semiconductor chip.

Referring now to FIGS. 1a, 1b and 1c an exemplary embodiment of the present invention is shown. FIG. 1a shows a plan view of a semiconductor chip. FIG. 1b is a cross sectional view showing a portion of the semiconductor chip. FIG. 1c is a perspective view showing a via electrode of the semiconductor chip.

As seen in FIGS. 1a and 1b, at least one via electrode 150 is formed passing through conductive pad 130 and a dielectric layer 120 and extending into substrate 110. Via electrode 150 includes a protrusion part 156 formed on conductive pad 130 and being electrically connected to a top of conductive pad 130 exposed from the dielectric 120. Body part 154 passes through conductive pad 130 and the dielectric layer 120 and extends into substrate 110 directly under protrusion part 156. Spike part 152 extends into substrate 110 directly under body part 154. Via electrode 150 may be formed in a single body such that spike part 152, body part 154 and protrusion part 154 are connected to each other. Body part 154 and spike part 152 are electrically insulated from substrate 110, the dielectric layer 120 and conductive pad 130 by spacer insulation layer 140.

As an alternative example, an upper portion of a sidewall of body part 154 may contact a sidewall of conductive pad 130 by removing spacer insulation layer 140 adjacent to the sidewall of conductive pad 130. Spike part 152 may have at least two, and in an exemplary embodiment three, spike elements, the spike elements becoming narrow in diameter as they extend further away from conductive pad 130. Each spike element may have a smaller diameter than the diameter of body part 154. Additionally, spike part 152, which is used as a multi-prong contact terminal of via electrode 150, is exposed from a backside surface of substrate 110 by removing the backside of the substrate at a predetermined thickness, thereby to be able to combine the chip with another device by penetrating the exposed portion of spike part 152 into a portion of the device like a fork. As such, the exemplary embodiment of the present invention can provide high connectability.

Figure 2:
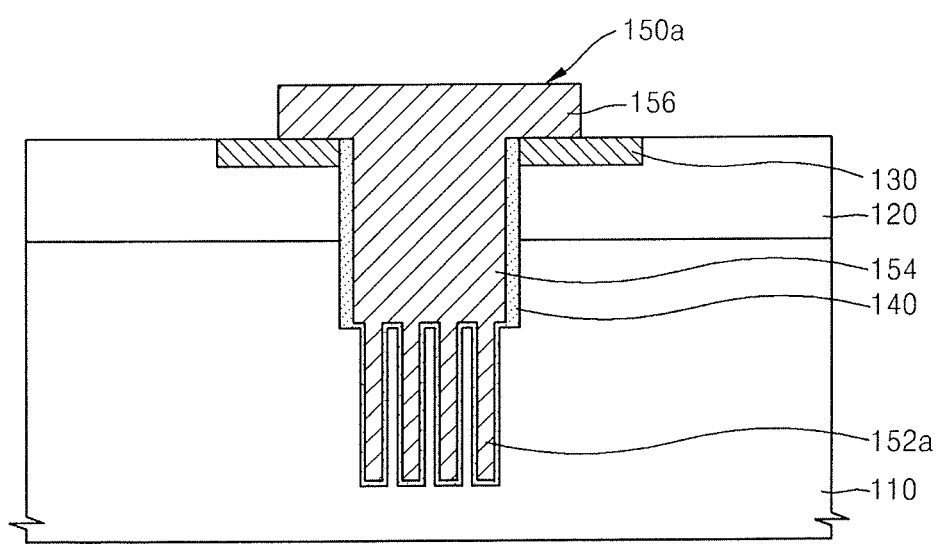
FIG. 2 is a cross sectional view showing a portion of a chip according to an exemplary embodiment which is a variation of the exemplary embodiment depicted in FIG. 1b.

FIG. 2 is a cross sectional view showing a portion of a chip according to an exemplary embodiment which is a variation of the exemplary embodiment depicted in FIG. 1b wherein the spike elements do not taper in diameter. Via electrode 150a includes protrusion part 156, body part 154 and spike part 152a. In this embodiment, each spike element of spike part 152a is of a cylindrical shape having the same spike element thickness.

Figure 3:
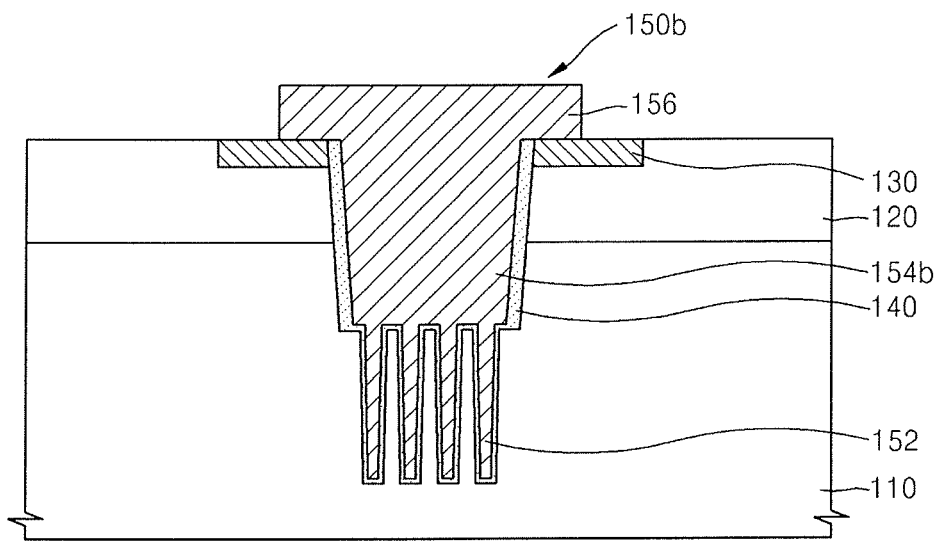
FIG. 3 is a cross sectional view showing a portion of a chip according to an exemplary embodiment which is another variation of the exemplary embodiment depicted in FIG. 1b.

FIG. 3 is a cross sectional view showing a portion of a chip according to an exemplary embodiment which is another variation of the exemplary embodiment depicted in FIG. 1b wherein the body part tapers in diameter. Via electrode 150b includes protrusion part 156, body part 154b and spike part 152. Both body part 154b and spike part 152 become narrow in their diameters as they extend further away from conductive pad 130.

Figure 4:
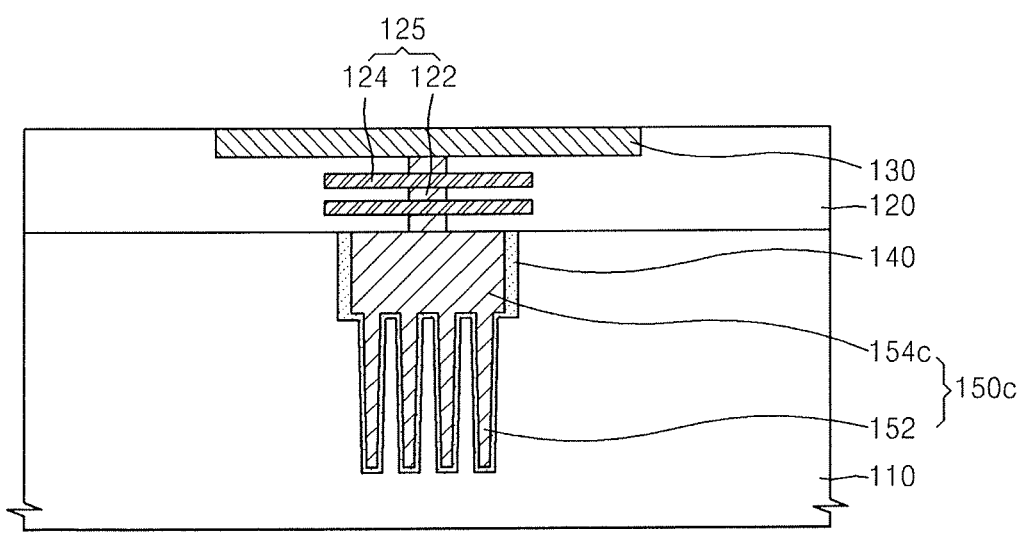
FIG. 4 is a cross sectional view showing an exemplary embodiment of portion of a chip which is still another variation of the exemplary embodiment depicted in FIG. 1b.

FIG. 4 is a cross sectional view showing an exemplary embodiment of a portion of a chip which is still another variation of the exemplary embodiment depicted in FIG. 1b wherein an interconnection pattern is included in the dielectric layer 120, which in an exemplary embodiment is an interlayer metal dielectric layer. Via electrode 150c includes body part 154c and spike part 152. Body part 154c extends into substrate 110 from a front side thereof (top as viewed in FIG. 4) without passing through conductive pad 130 and the dielectric layer 120 but is electrically connected to conductive pad 130 using an interconnection pattern 125 having interconnection lines 124 and plug patterns 122.

Figure 5:
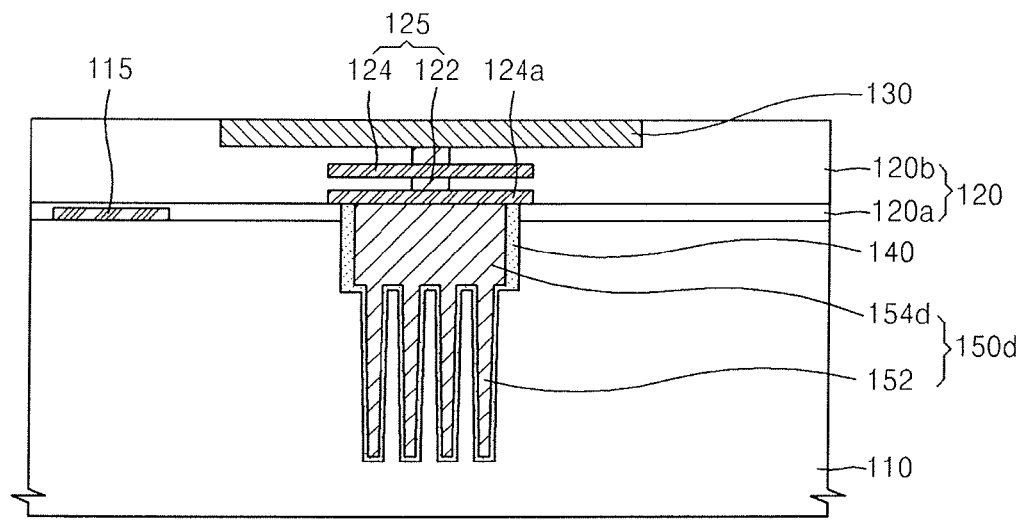
FIG. 5 is a cross sectional view showing an exemplary embodiment which is a variation of the embodiment depicted in FIG. 4.

FIG. 5 is a cross sectional view showing an exemplary embodiment which is a variation of the embodiment depicted in FIG. 4 wherein the body part extends into the interlayer dielectric layer. Via electrode 150d includes body part 154d and spike part 152. Unlike body part 154c in FIG. 4, body part 154d extends into interlayer dielectric layer 120a but does not extend into interlayer metal dielectric layer 120b. That is, body part 154d extends into substrate 110 directly under from bottommost interconnection line 124a through the interlayer dielectric layer 120a. Interlayer dielectric layer 120a includes circuit layer 115, which may provide for a capacitor in DRAM, cell transistor, bit line in Flash memory, or other circuit elements or interconnection lines. In other exemplary embodiments interlayer metal dielectric layer 120b may also include the interconnection pattern 125 having interconnection lines 124 and plug pattern 122.

Figure 6:
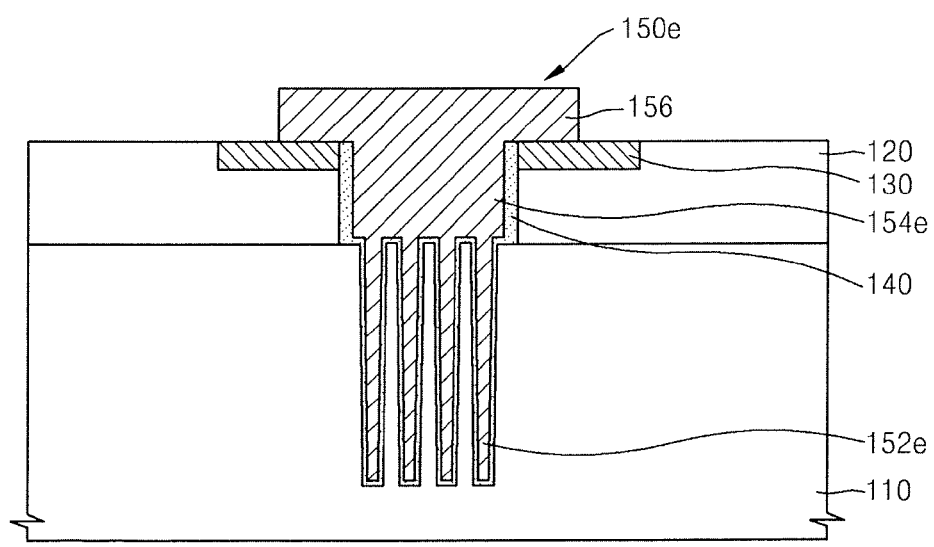
FIG. 6 is a cross sectional view showing an exemplary embodiment which is still another variation of the embodiment depicted in FIG. 1b.

FIG. 6 is a cross sectional view showing an exemplary embodiment which is still another variation of the embodiment depicted in FIG. 1b wherein the body part does not extend into the substrate. Via electrode 150e includes protrusion part 156, body part 154e and spike part 152e. Body part 154e passes through conductive pad 130 extending until the front side surface of substrate 110 and spike part 152e extends into substrate 110 from the front side surface of substrate 110.

Figure 7:
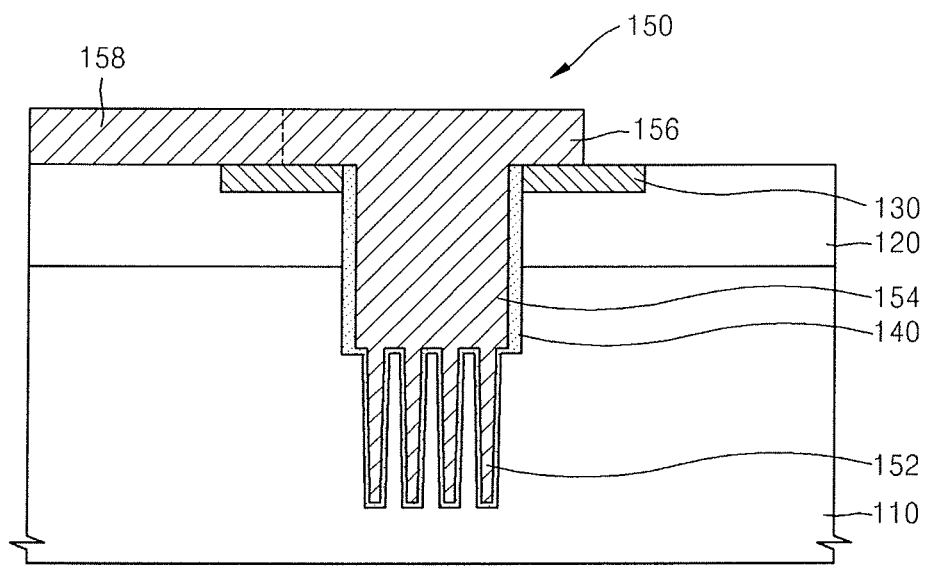
FIG. 7 is a cross sectional view showing an exemplary embodiment which is another variation of the embodiment depicted in FIG. 1b.

FIG. 7 is a cross sectional view showing an exemplary embodiment which is another variation of the embodiment depicted in FIG. 1b wherein a redistribution line is connected to the protrusion part. Via electrode 150 further includes redistribution line 158 connected to protrusion part 156, and when there is a connection between the chip and other devices, particularly when the other devices have a different size as compared with the chip, redistribution line 158 acts as a connection terminal that connects the chip to the other device. Redistribution line 158 may similarly be connected to protrusion part 156 previously shown in FIGS. 2, 3, and 6 and as will be shown in FIGS. 8 and 9 below. Redistribution line 158 may also be directly connected to conductive pad 130 shown in FIGS. 4 and 5.

Figure 8:
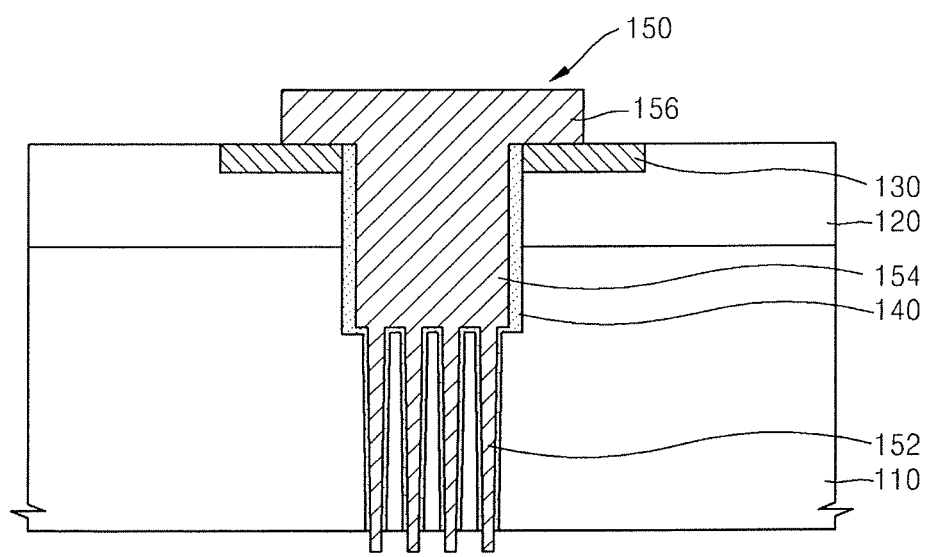
FIG. 8 is a cross sectional view showing an exemplary embodiment which is yet another variation of the embodiment depicted in FIG. 1b.
Figure 9:
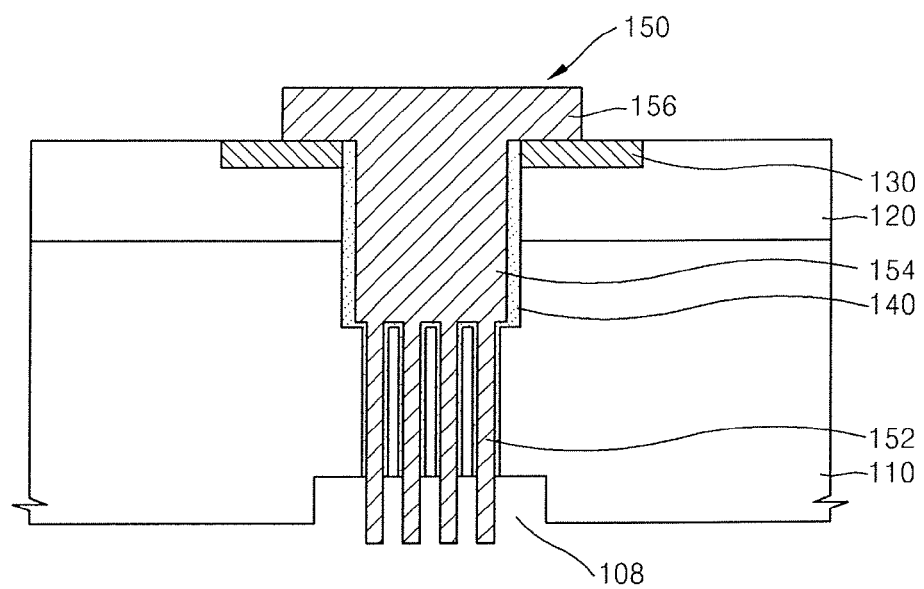
FIG. 9 is an alternative to the exemplary embodiment depicted in FIG. 8.

FIG. 8 is a cross sectional view showing an exemplary embodiment which is yet another variation of the embodiment depicted in FIG. 1b wherein the spikes extend beyond the substrate. Via electrode 150 passes through substrate 110. That is, spike part 152 of via electrode 150 is exposed from the backside surface of substrate 110 (bottom as seen in FIG. 9) and/or protrudes from substrate 110. In this case, spacer insulation layer 140 may be removed adjacent the exposed or protruding spike part 152. The exposed or protruding via electrode structure is also applicable to via electrodes 150a, 150b, 150c, 150d, 150e as shown in FIGS. 2-7.

Referring now to FIG. 9, as an alternative to the exemplary embodiment depicted in FIG. 8, trench 108 may be formed which additionally exposes sidewalls of a lower portion of each spike part 152 by recessing a portion of the backside of substrate 110 adjacent to spike part 152. Spacer insulation layer 140 is also removed within the trench area.

Figure 10:
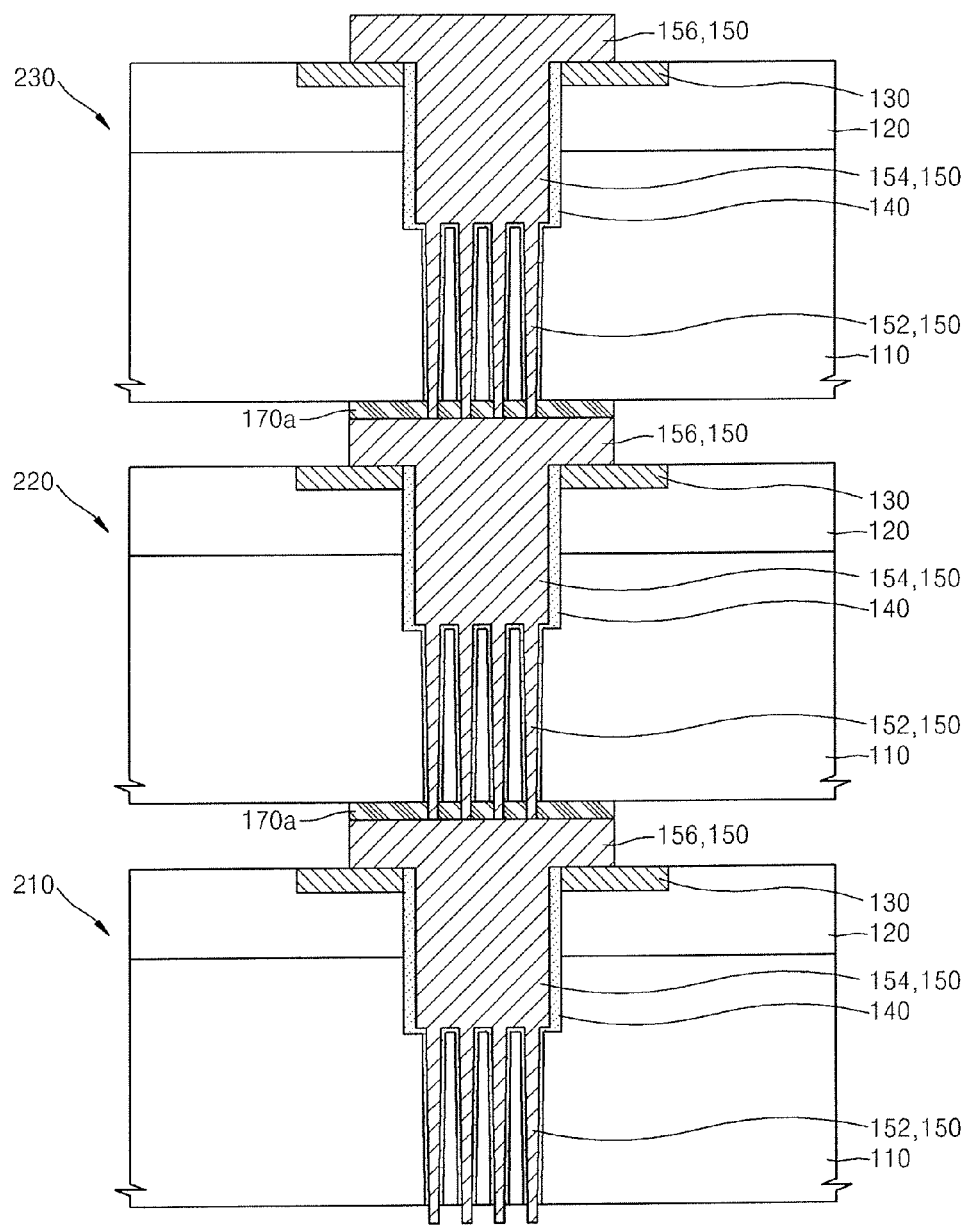
FIG. 10 is a cross sectional view showing an exemplary embodiment of a stack module.

FIG. 10 is a cross sectional view showing an exemplary embodiment of a stack module. The stack module provides for multiple chips by stacking the chips together and whose via electrodes interconnect adjacent chips. In FIG. 10 three semiconductor chips 210, 220, 230 are sequentially stacked each other using conductive bumps 170a. However, this is just an exemplary embodiment. As such, there is no limitation in the number of chips that can be stacked. The chips may be at least one of the chips in FIGS. 8 and 9 and also the chips including via electrodes 150a, 150b, 150c, 150d, 150e in FIGS. 2-6 if they have their spike parts exposed from substrate 110. In the embodiment of FIG. 10 the chips have the same size as each other. The via electrode 150 of chip 230 is connected to the conductive bump 170a of chip 220 by penetrating spike parts 152 of via electrode 150 of chip 230 into the conductive bump 170a of chip 220. The cylindrical structure of the spike parts 152 provides increased contact area between the spike parts 152 and the conductive bump 170a. Similarly, the via electrode 150 of chip 220 is connected to the conductive bump 170a of chips 210 by penetrating spike parts 152 of via electrode 150 of chip 220 into the conductive bump 170a of chip 210.

Figure 11:
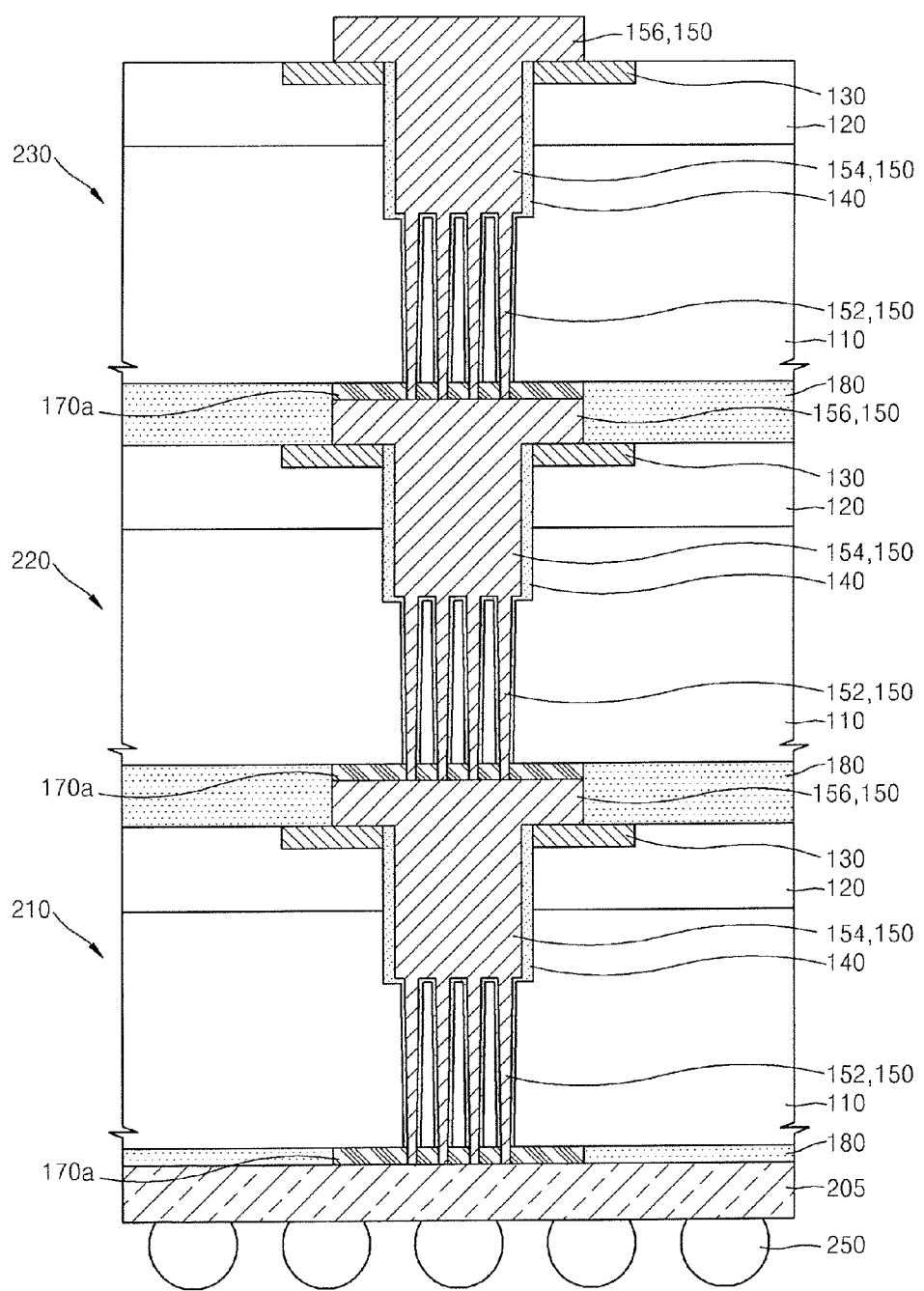
FIG. 11 is a cross sectional view showing an exemplary embodiment of a stack module which is a variation of the exemplary embodiment depicted in FIG. 10.

FIG. 11 is a cross sectional view showing an exemplary embodiment of a stack module which is a variation of the exemplary embodiment depicted in FIG. 10 wherein one of the semiconductor chips is stacked on a module substrate. Chips 210, 220, 230 are stacked together on module substrate 205, which may include, for example, a PCB or tape type substrate. Spike part 152 of chip 210 penetrates into conductive bump 170a formed on module substrate 205. An adhesive layer 180 is further provided between chips 210, 220, 230. Solder ball 250 is further provided on the backside of module substrate 205 opposite to the front side on which conductive bump 170a is formed.

Figure 12:
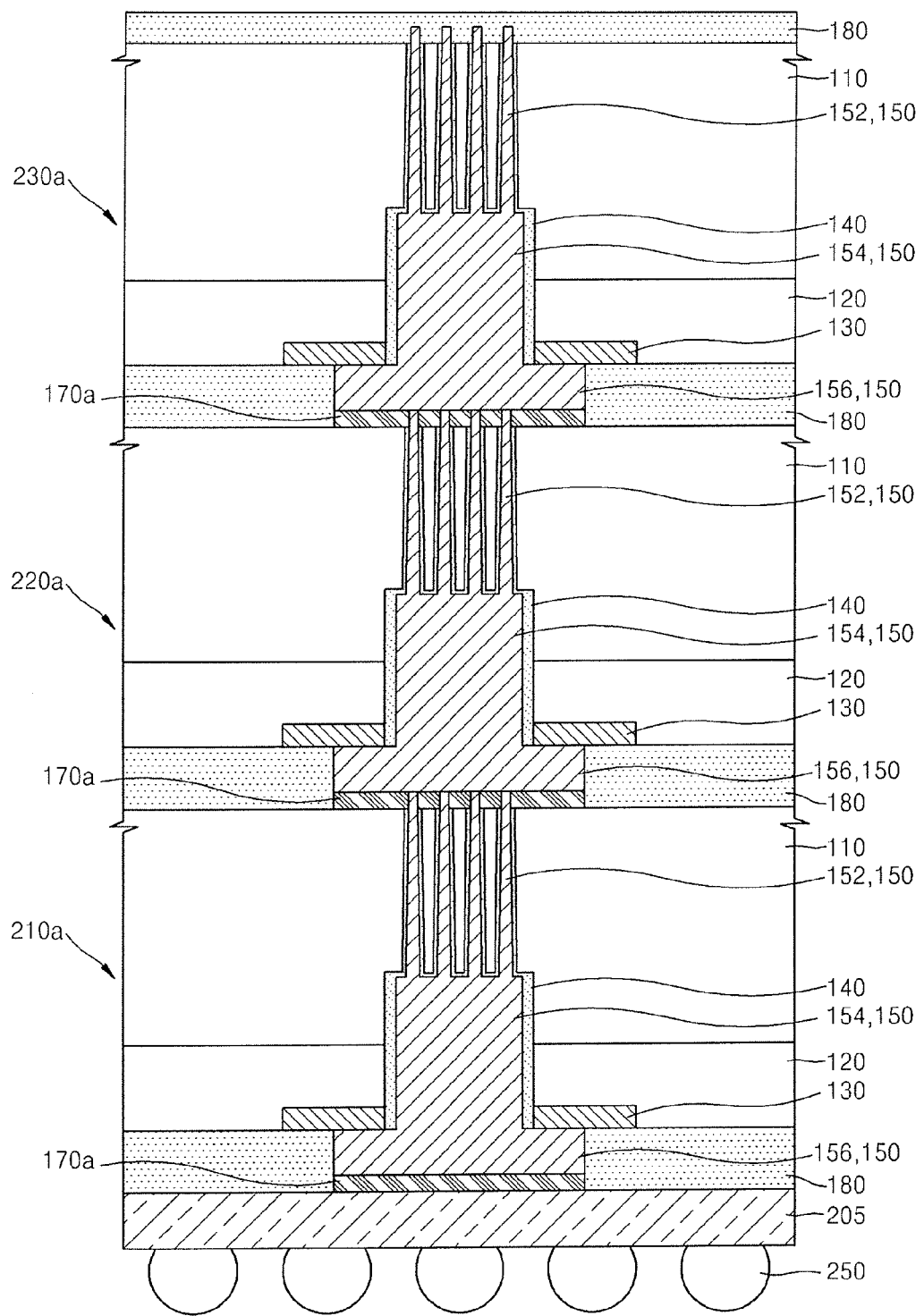
FIG. 12 is a cross sectional view showing an exemplary embodiment of a stack module which is a variation of the embodiments depicted in FIGS. 10 and 11.

FIG. 12 is a cross sectional view showing an exemplary embodiment of a stack module which is a variation of the embodiments depicted in FIGS. 10 and 11 wherein the direction of the via electrodes is reversed. Each protrusion part 156 of via electrodes 150 of chips 210, 220, 230 in FIG. 11 is turned over facing conductive bump 170a formed on module substrate 205. Protrusion part 156 of chip 210a is then connected onto conductive bump 170a of module substrate 205.

Figure 13:
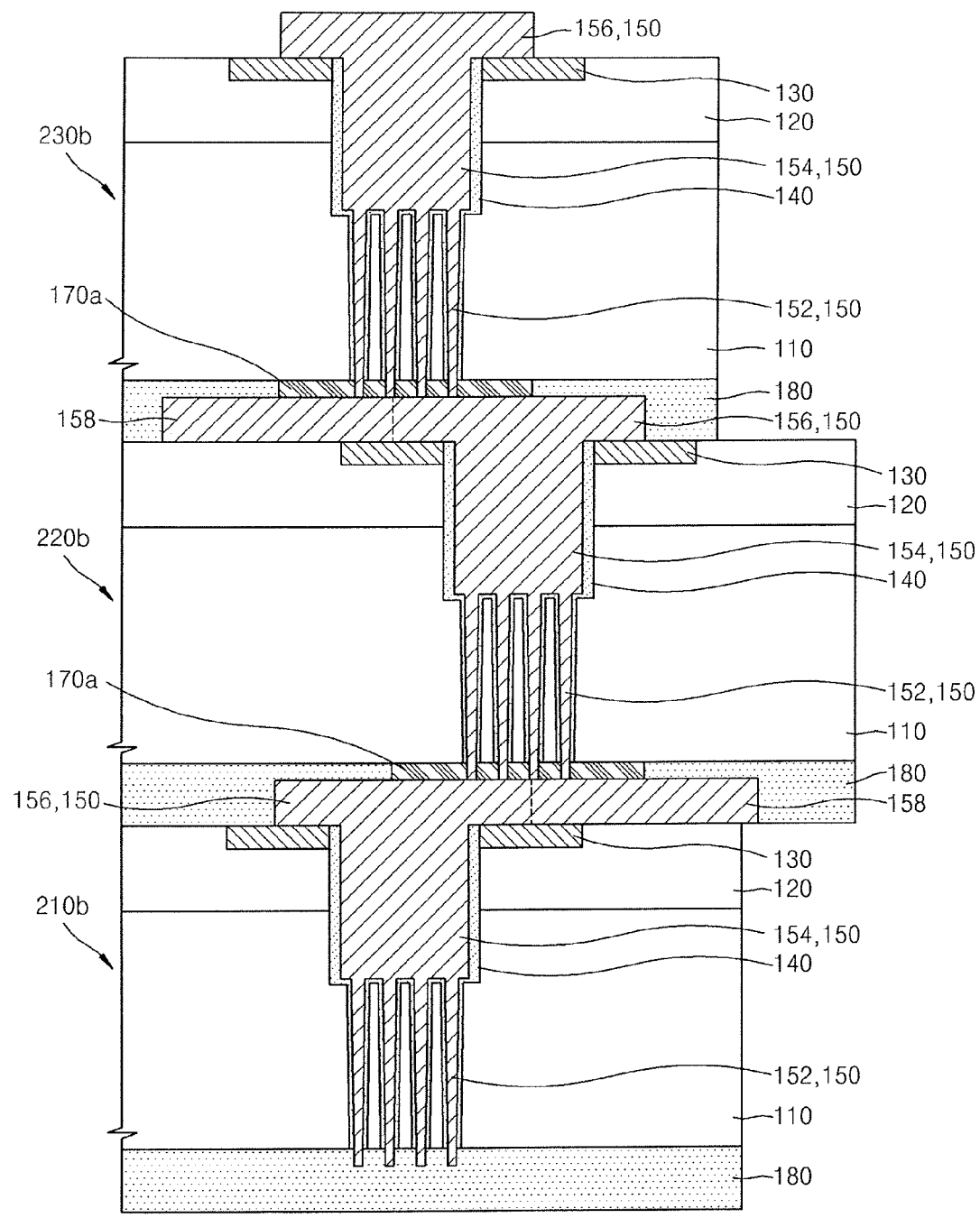
FIG. 13 is a cross sectional view showing an exemplary embodiment of a stack module which is a variation of the embodiment depicted in FIG. 11.

FIG. 13 is a cross sectional view showing an exemplary embodiment of a stack module which is a variation of the embodiment depicted in FIG. 11. As compared with FIG. 11, chips 210b, 220b, 230b have the different sizes from each other and the chips 220b, 210b, include redistribution lines 158 as depicted in FIG. 7. For example, at least one of the chips 210b, 220b, 230b may be the same type device or a different type of device having sizes different from each other such that the chips configure a System In Package (SIP). Via electrodes 150 of chips 210b, 220b, 230b may not be aligned with each other along the vertical direction. Via electrode 150 of chip 230b extends under substrate 110 of chip 230b and connects to redistribution line 158 of chip 220b through a conductive bump 170a. Also, via electrode 150 of chip 220b extends under substrate 110 of chip 220b and connects to redistribution line 158 of chip 210b through conductive bump 170a.

Those skilled in the art will appreciate that if the exemplary embodiments depicted in FIGS. 10-13 were modified such that the trench 108 as shown in FIG. 9 is included in substrates 110, additional contact area between spike parts 152 and conductive bump 170a will be provided and add further interconnection strength.

Figure 14:
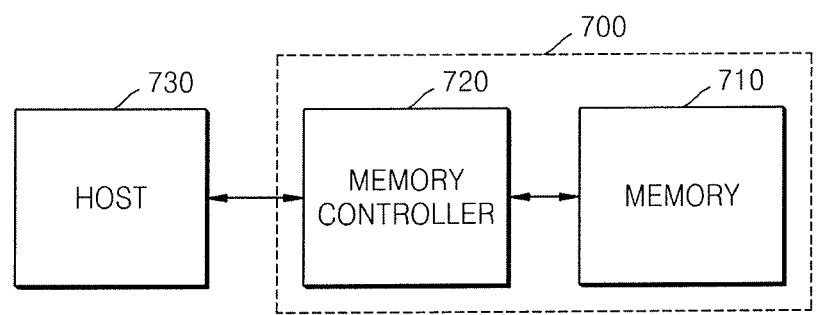
FIGS. 14, 15 and 16 show exemplary embodiments of electronic subsystems in accordance with the present invention.
Figure 15:
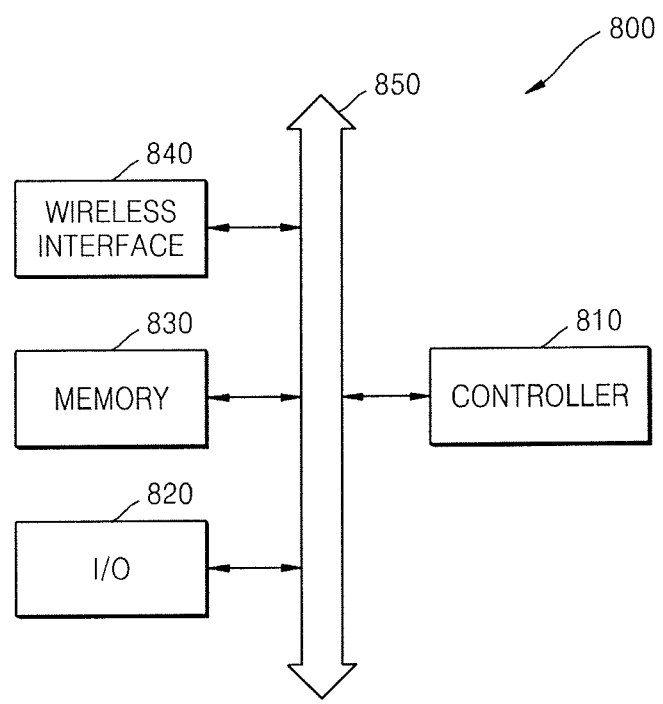
Figure 16:
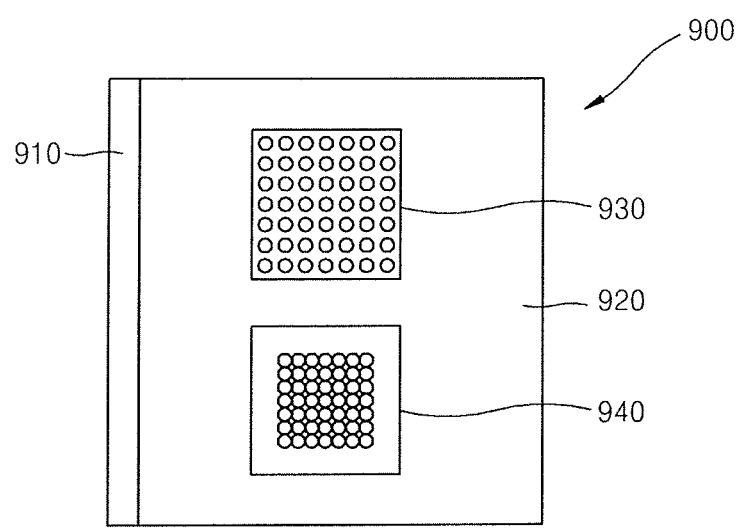

Referring now to FIGS. 14-16, various electronic subsystems are depicted which implement at least one of the exemplary embodiments described above.

FIG. 14 shows an electronic subsystem which includes a semiconductor device according to at least one exemplary embodiment of the present invention. Electronic subsystem 700 includes a memory controller 720 and a memory 710, either of which may have a structure according to at least one exemplary embodiment of the present invention. The memory controller 720 controls the memory device 710 to read or write data from/into the memory 710 in response to a read/write request of a host 730. The memory controller 720 may include an address mapping table for mapping an address provided from the host 730 (e.g., mobile devices or computer systems) into a physical address of the memory device 710. By using semiconductor devices in accordance with at least one exemplary embodiment of the present invention reliable interconnection between layers of semiconductor chips in the memory controller and/or memory can result in better overall interconnection reliability of the electronic subsystem.

Referring to FIG. 15, an electronic subsystem including a semiconductor device according to at least one exemplary embodiment of the present invention will now be described. Electronic subsystem 800 may be used in a wireless communication device (e.g., a personal digital assistant, a laptop computer, a portable computer, a web tablet, a wireless telephone, a mobile phone and/or a wireless digital music player.) or in any device capable of transmitting and/or receiving information via wireless environments.

The electronic subsystem 800 includes a controller 810, an input/output (I/O) device 820 (e.g., a keypad, a keyboard, and a display), a memory 830, and a wireless interface 840, each device being coupled to a communication bus 850 and may have a structure according to at least one exemplary embodiment of the present invention. The controller 810 may include at least one of a microprocessor, a digital signal processor, or a similar processing device. The memory 830 may be used to store commands executed by the controller 810, for example. The memory 830 may be used to store user data. The electronic system 800 may utilize the wireless interface 840 to transmit/receive data via a wireless communication network. For example, the wireless interface 840 may include an antenna and/or a wireless transceiver. The electronic system 800 according to exemplary embodiments may be used in a communication interface protocol of a third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000. By using semiconductor devices in accordance with at least one exemplary embodiment of the present invention reliable interconnection between layers of semiconductor chips in the controller, I/O device, memory and/or wireless interface can result in better overall interconnection reliability of the electronic subsystem.

Referring to FIG. 16, an electronic subsystem including a semiconductor device according to at least one exemplary embodiment of the present invention will now be described. Electronic subsystem 900 may be a modular memory device and includes a printed circuit board 920. The printed circuit board 920 may form one of the external surfaces of the modular memory device 900. The printed circuit board 920 may support a memory unit 930, a device interface unit 940, and an electrical connector 910.

The memory unit 930 may have a various data storage structures, including at least one exemplary embodiment of the present invention, and may include a three-dimensional memory array and may be connected to a memory array controller. The memory array may include the appropriate number of memory cells arranged in a three-dimensional lattice on the printed circuit board 920. The device interface unit 940 may be formed on a separated substrate such that the device interface unit 940 may be electrically connected to the memory unit 930 and the electrical connector 910 through the printed circuit board 920. Additionally, the memory unit 930 and the device interface unit 940 may be directly mounted on the printed circuit board 920. The device interface unit 940 may include components necessary for generating voltages, clock frequencies, and protocol logic. By using semiconductor devices in accordance with at least one exemplary embodiment of the present invention reliable interconnection between layers of semiconductor chips in the memory unit can result in better overall interconnection reliability of the electronic subsystem.

Figure 17A:
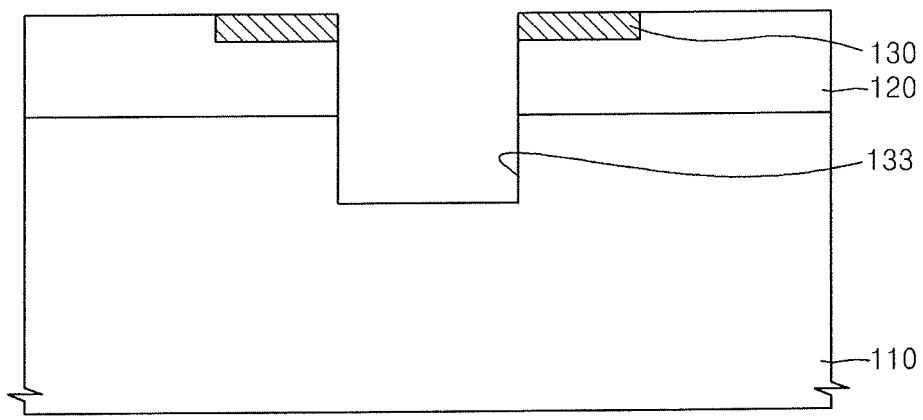
FIGS. 17a, 17b, 17c, 17d, 17e, 17f and 17g are cross sectional views showing an exemplary embodiment of a method for forming the exemplary embodiment depicted in FIG. 8.

FIGS. 17a-17g are cross sectional views showing an exemplary embodiment of a method for forming the exemplary embodiment depicted in FIG. 8. Referring first to FIG. 17a, via trench 133 is formed through conductive pad 130, dielectric layer 120 and a portion of substrate 110 using laser drilling and/or a dry etch using a conventional photo mask pattern.

Figure 17B:
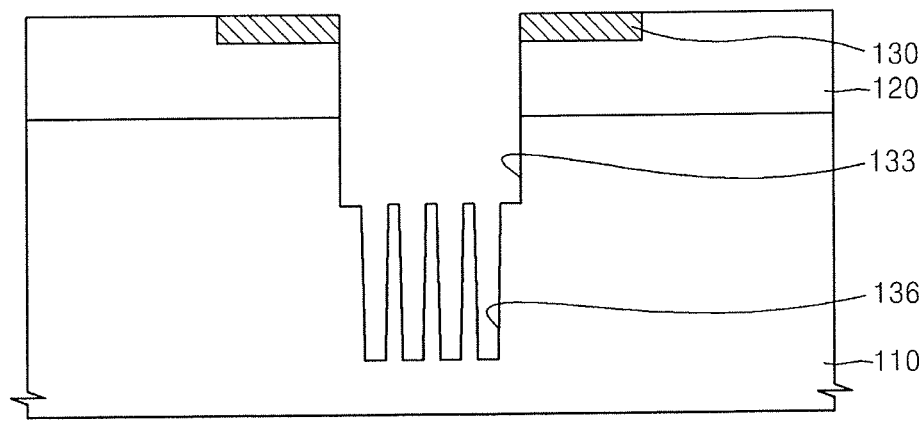

As seen in FIG. 17b, spike trench 136 is formed extending into substrate 110 from the bottom surface of via trench 133. Spike trench 136 does not pass through substrate 110 nor does it extend to the backside surface of substrate 110. Spike trench 136 may be formed by etching the exposed substrate directly under via trench 133 using a conventional photo mask pattern. In an exemplary embodiment, each finger of spike trench 136 has a diameter of about 5 μm and via trench 133 has a diameter of about 30-35 μm. Alternatively, each finger of spike trench 136 having a diameter of about 10 μm may be formed using the laser drilling having a beam size of about 10 μm in case of via trench 133 having the diameter of about 30-35 m. A depth of via trench 133 may be almost the same as the depth of spike trench 136 or even larger than the depth of spike trench 136 in view of the needed filling characteristics. Because the depth of via trench 133 can be shorter than the depth of a conventional via trench having no spike trench 136, the aspect ratio of via trench 133 can become smaller than the aspect ratio of the conventional via trench. As such, the smaller aspect ratio helps prevent a void from being formed during filling for a TSV.

Figure 17C:
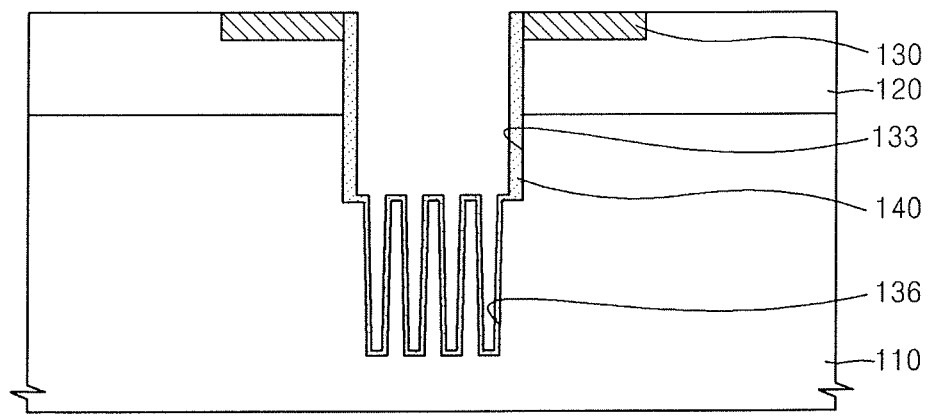

As seen in FIG. 17c, spacer insulation layer 140 is then formed along the surface of via trench 133 and spike trench 136, and the inner surface of conductive pad 130.

Figure 17D:
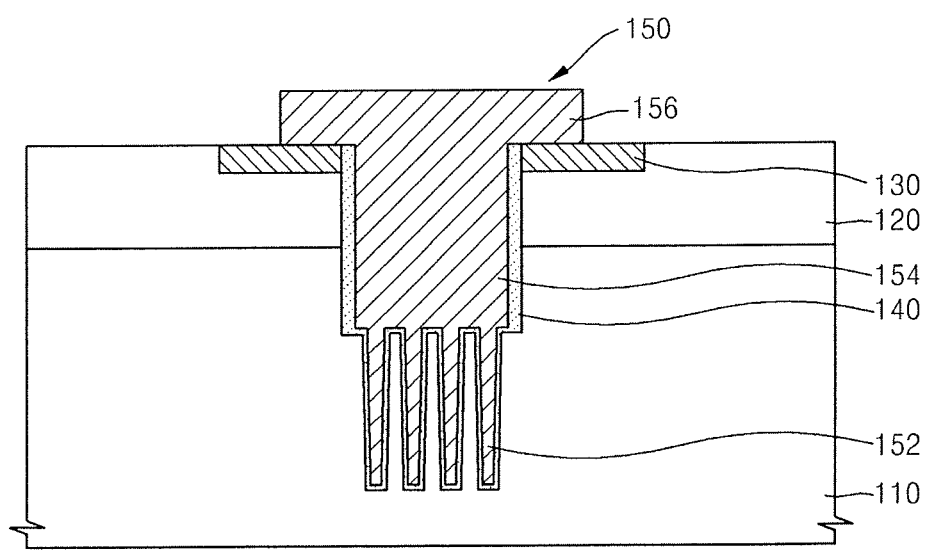

As seen in FIG. 17d, via electrode 150 is formed filling spike trench 136 and via trench 133 with conductive material and extending onto conductive pad 130. Those exemplary embodiments having tapered diameter trenches make it easier and less time consuming to fill the conductive material.

Figure 17E:
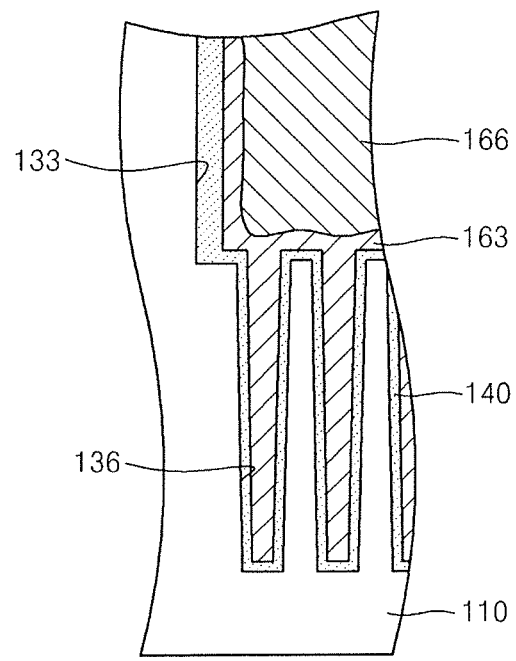

As depicted in FIG. 17e, spike part 152 may have a first conductive layer 163 made of W, Al or poly silicon, and body part 154 and protrusion part 156 may include both the first conductive layer 163 and second conductive layer 166 made of Cu using conventional plating methods. When using Cu as a material of spike part 152, Cu exposed from the backside surface of substrate 110 may act as a contamination source.

But, in some cases, first and second conductive layers 163, 166 may include Cu, W, Al, or poly silicon.

First conductive layer 163 further extends along the sidewall and bottom region of via trench 133. A barrier metal may be further formed under first and second conductive layers 163, 166. The barrier metal may be made of at least one of Ti, Ta, TiN or TaN.

Figure 17F:
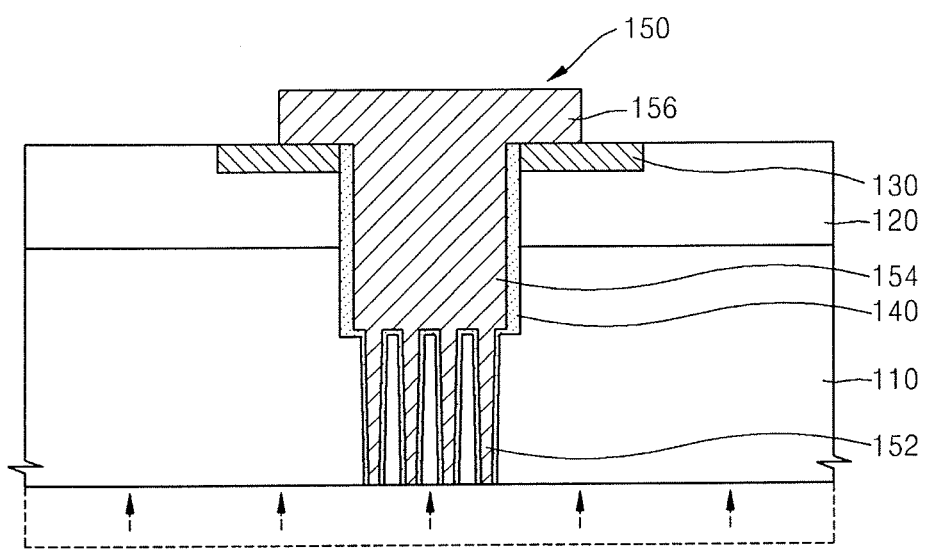

As seen in FIG. 17f, a bottom portion of spike part 152 is exposed from the backside of substrate 110 by removing the backside portion of substrate 110 at a predetermined thickness using an etch back and/or chemical-mechanical polishing (CMP), followed by removing the bottom portion of spacer insulation layer 140, so that via electrode 150 may pass through substrate 110.

Figure 17G:
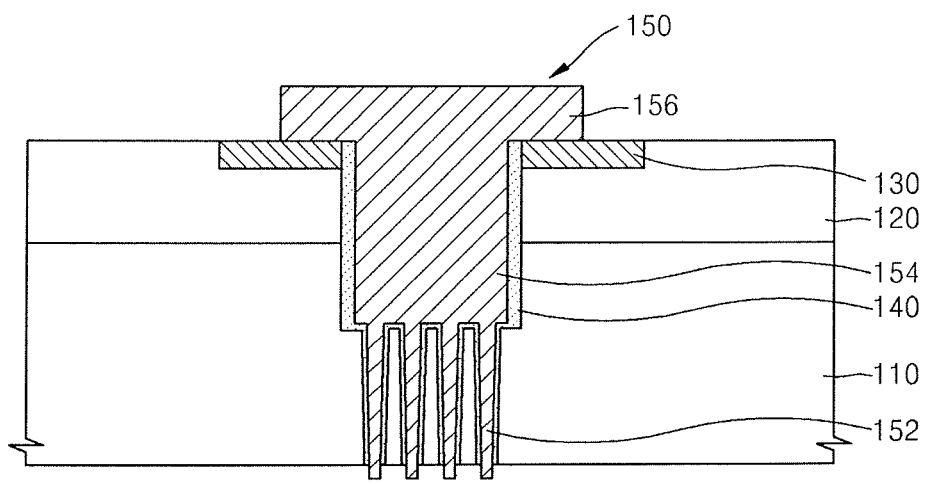

As seen in FIG. 17g, by removing using an anisotropic and/or isotropic etch even more of the backside of substrate 110, the bottom portion of spike part 152 including the sidewall thereof can protrude from the backside of substrate 110. At this time, a portion of spacer insulation layer 140 exposed adjacent the sidewall of spike part 152 is selectively removed.

FIGS. 17a and 17b are cross sectional views showing an exemplary embodiment of a method for forming the exemplary embodiments of the stack modules depicted in FIG. 10 or 11, but would also applicable to the exemplary embodiments depicted in FIGS. 17 and 17.

Figure 18A:
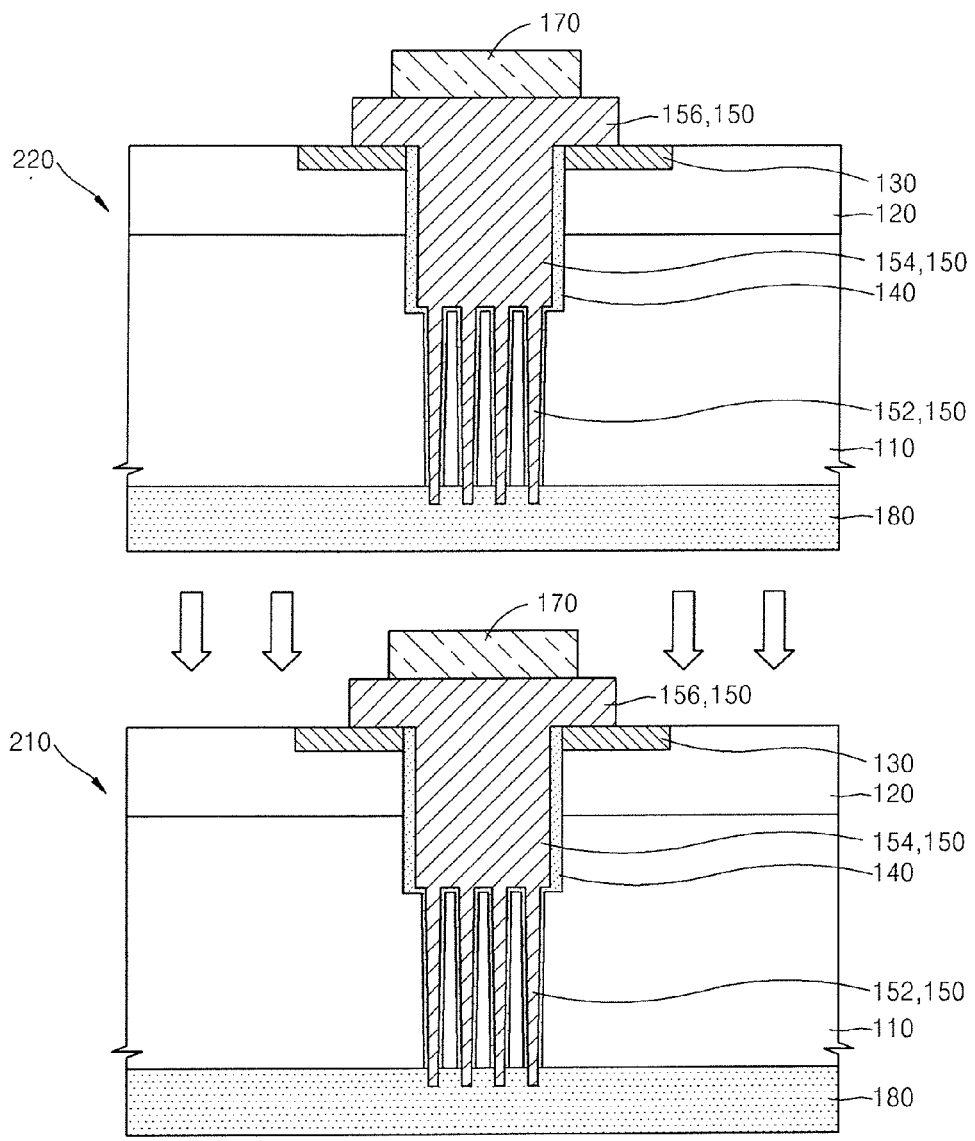
FIGS. 18a and 18b are cross sectional views showing an exemplary embodiment of a method for forming the exemplary embodiments of the stack modules depicted in FIG. 10 or 11.

Referring first to FIG. 18a, on each protrusion part 156 of via electrodes 150 of chips 210, 220 is formed conductive bump 170, and on each backside surface of chips 210, 220 is formed adhesive layer 180. After stacking these chips 210, 220 to each other, chips 210, 220 are compressed to each other by pressure.

Figure 18B:
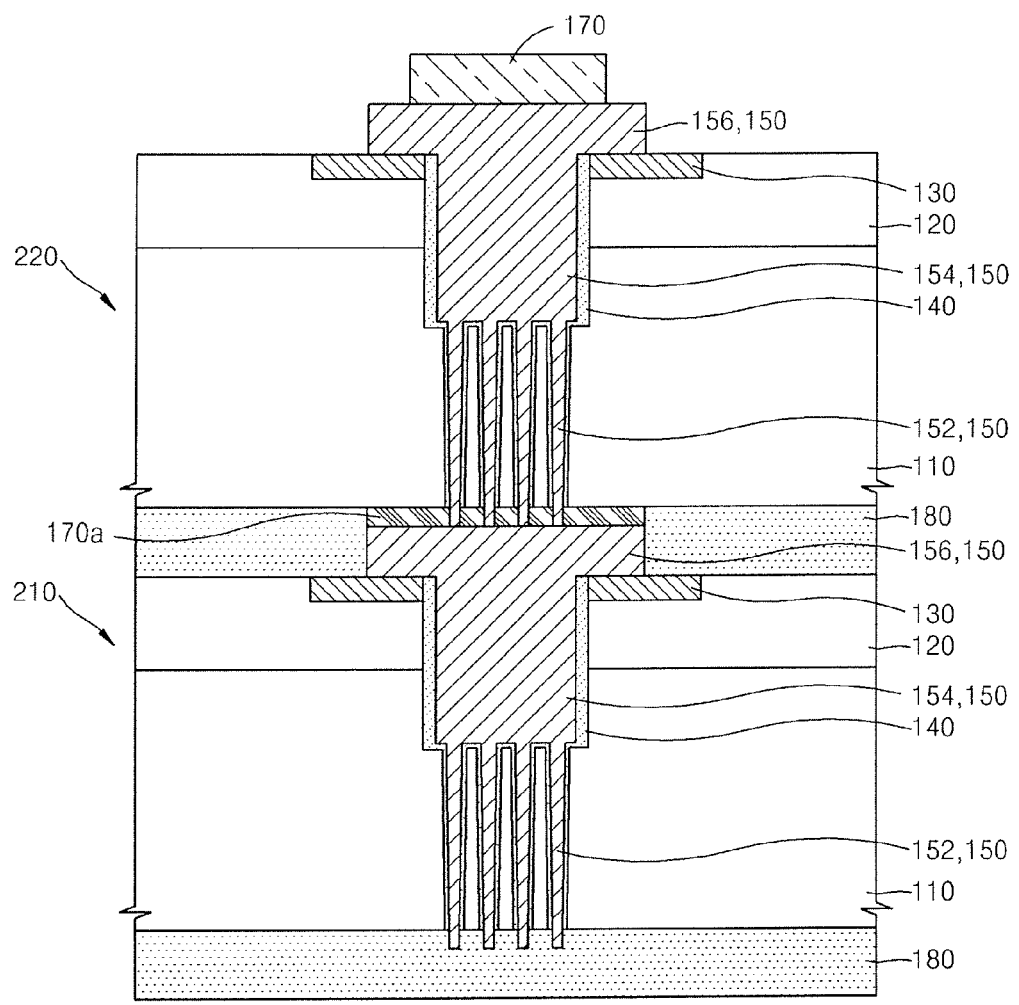

As seen in FIG. 18b, chips 210, 220 are attached each other by adhesive layer 180 and spike part 152 of chip 220 penetrating into compressed conductive bump 170a of chip 210 by the pressure. Optionally, by reflowing conductive bump 170a, the connection strength between spike part 152 and conductive bump 170a may be increased even more.

FIGS. 19a-19d are cross sectional views showing an exemplary embodiment of a method of forming the chips depicted in FIG. 4 or 5 and is a variation of the method depicted in FIGS. 17a-17e wherein interconnection lines are included.

Figure 19A:
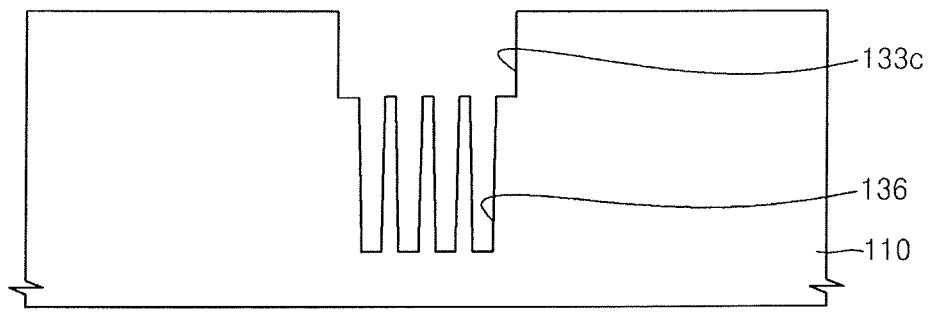
FIGS. 19a, 19b, 19c and 19d are cross sectional views showing an exemplary embodiment of a method of forming the chips depicted in FIG. 4 or 5 and is a variation of the embodiment depicted in FIGS. 17a-17g.

Referring first to FIG. 19a, before forming the dielectric layer 120 and conductive pad 130, via trench 133c is formed extending into substrate 110 from the front surface thereof. Spike trench 136 extends into substrate 110 directly under the bottom surface of via trench 133c.

Figure 19B:
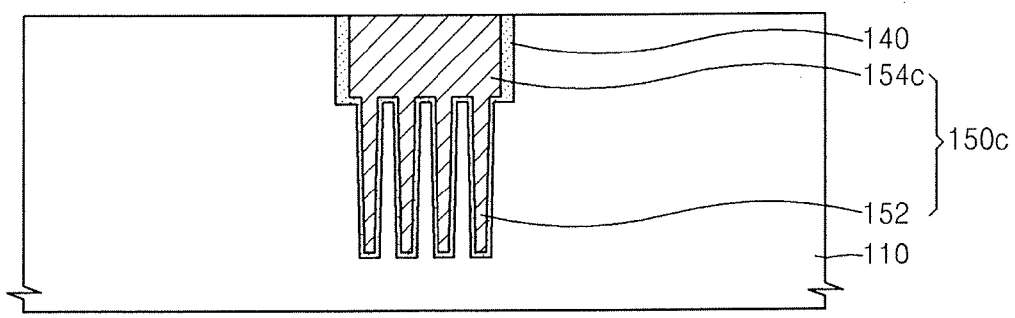

As seen in FIG. 19b, via electrode 150c consisting of body part 154c and spike part 152, without a protrusion part, is formed in via trench 133c and spike part 136. Via electrode 150c may be formed by filling a conductive layer in these trenches and then, planarizing the conductive layer until the front surface of substrate 110 is exposed, but not patterning as in FIG. 17d.

Figure 19C:
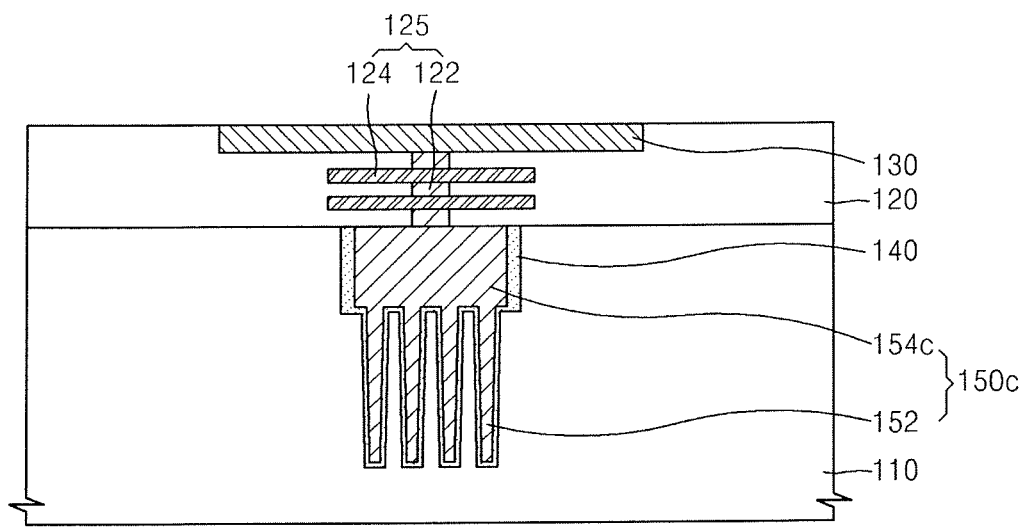

Referring to FIG. 19c, the dielectric layer 120, for example, an interlayer metal dielectric layer, interconnection pattern 125, which includes interconnection lines 124 and plug patterns 122, and conductive pad 130 are sequentially formed on the front surface of substrate 110 over via electrode 150c as shown in FIG. 4 or 5.

Figure 19D:
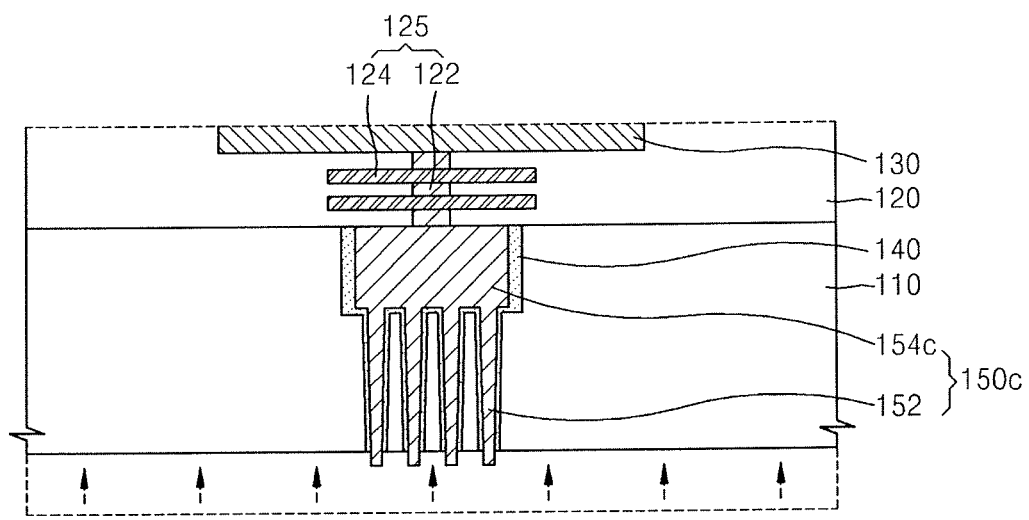

As seen in FIG. 19d, by removing a backside portion of substrate 110, a bottom portion of spike part 152 is exposed protruding from the backside surface of substrate 110.

Figure 20A:
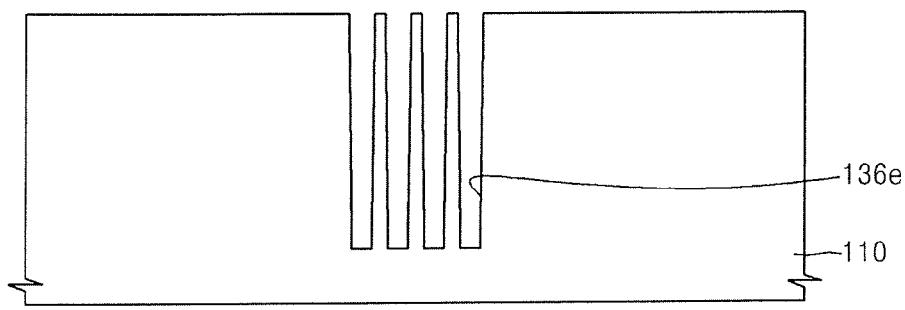
FIGS. 20a, 20b, 20c and 20d are cross sectional views showing an exemplary embodiment of a method of forming the chip depicted in FIG. 6.

FIGS. 20a-20d are cross sectional views showing an exemplary embodiment of a method of forming the chip depicted in FIG. 6. Referring to FIG. 20a, spike trench 136e is formed extending into substrate 110 from the front surface of substrate 110.

Figure 20B:
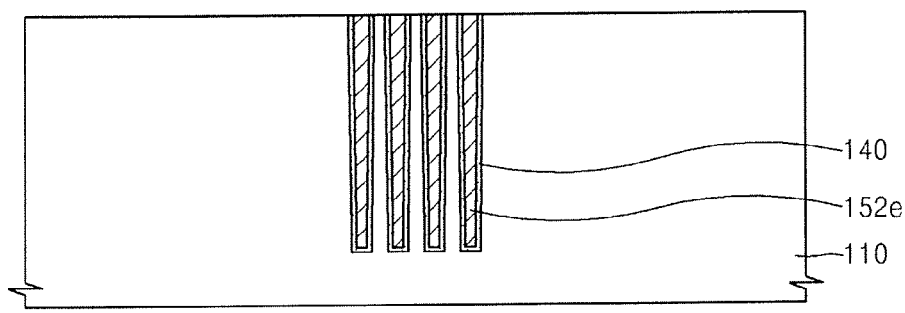

As seen in FIG. 20b, spike part 152e is formed by filling a conductive layer into spike trench 136e.

Figure 20C:
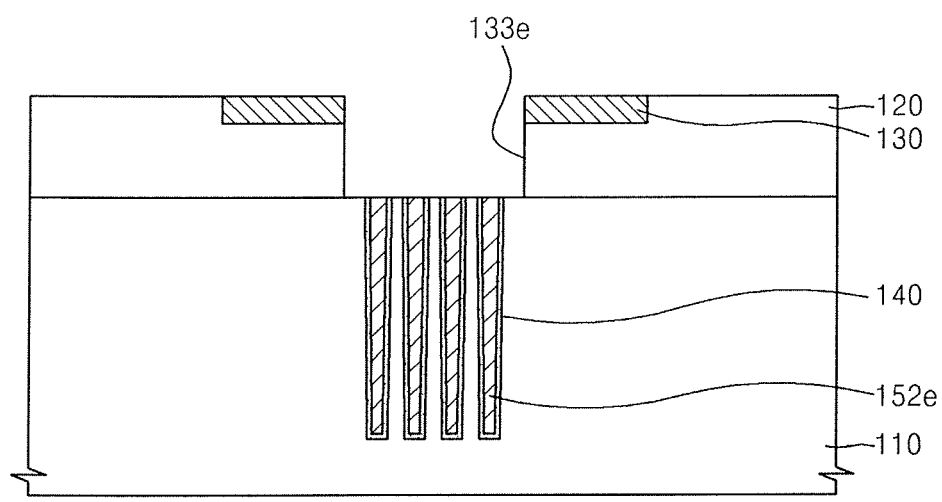

As seen in FIG. 20c, dielectric layer 120 and conductive pad 130 are sequentially formed directly over spike part 152e formed into substrate 110. Via trench 133e is then formed passing through conductive pad 130 and the dielectric layer 120 and exposing spike part 152e.

Figure 20D:
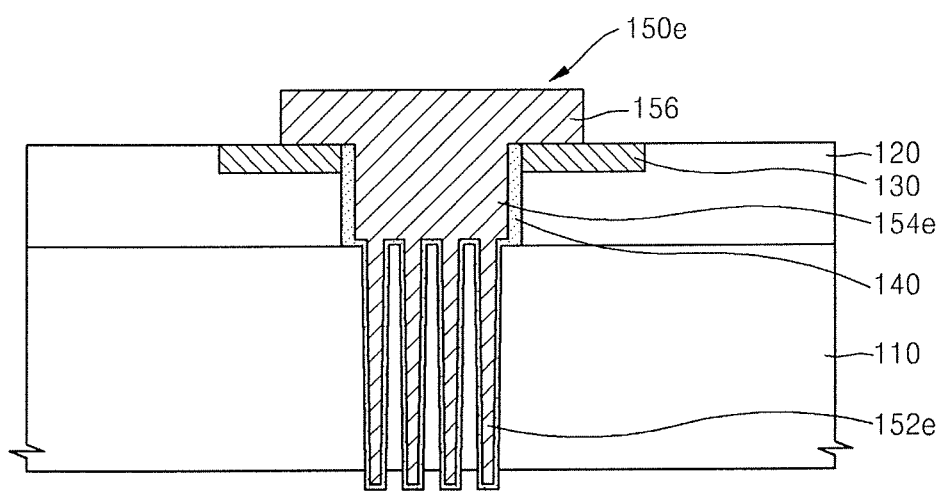

Referring now to FIG. 20d, via electrode 150e, including body part 154 filling via trench 133e and protrusion part 156 protruding from conductive pad 130, are formed contacting spike part 152e. The bottom portion of via electrode 150e protrudes from the backside surface of substrate 110.

Figure 21A:
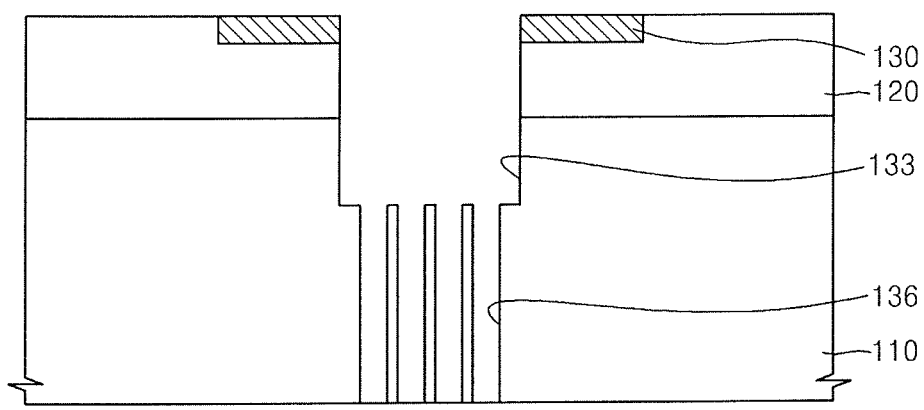
FIGS. 21a, 21b and 21c are cross sectional views of an exemplary embodiment which is a variation of the embodiment depicted in FIGS. 17a-17g.
Figure 21B:
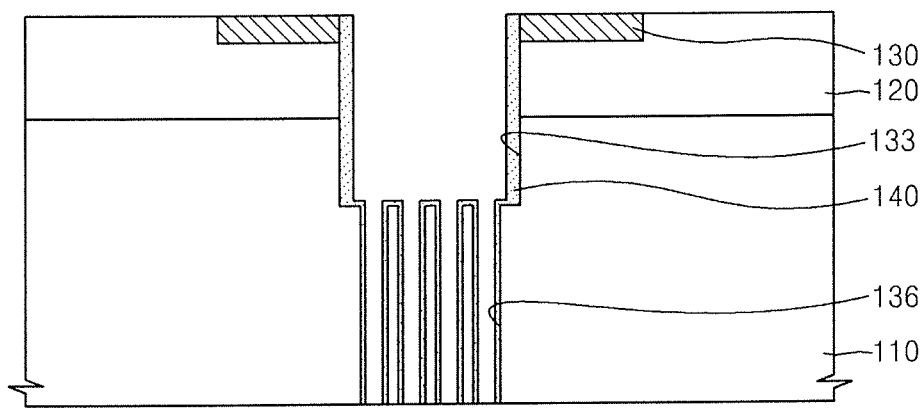
Figure 21C:
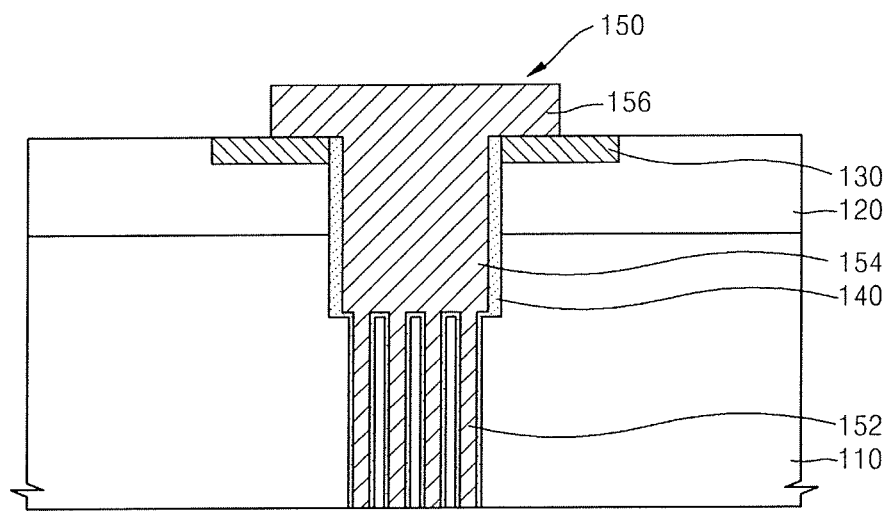

FIGS. 21a-21c are cross sectional views of an exemplary embodiment which is a variation of the embodiment depicted in FIGS. 17a-17g. The variation includes, after forming via trench 133, forming spike trench 136 by etching or drilling from the backside of substrate 110 toward the bottom surface of via trench 133. The shape of spike trench 136 may be a cylinder type, a tapered type or a reverse tapered type.

Figure 22:
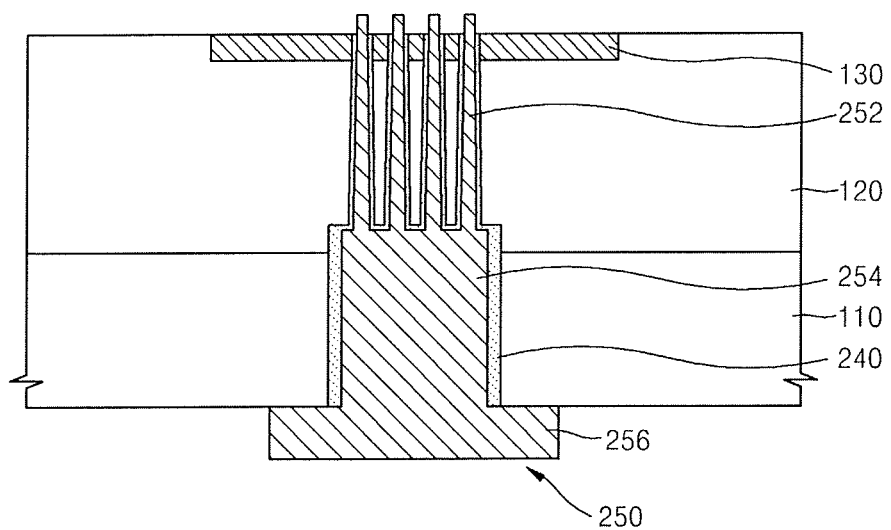
FIG. 22 is a cross sectional view showing an exemplary embodiment of portion of a chip which is still another variation of the exemplary embodiment depicted in FIG. 1b.

FIG. 22 is a cross sectional view showing an exemplary embodiment of portion of a chip which is still another variation of the exemplary embodiment depicted in FIG. 1b.

Referring to FIG. 22, at least one via electrode 250 is formed passing through the conductive pad 130, the dielectric layer 120 and the substrate 110. The via electrode 250 includes a protrusion part 256 formed on the substrate 110, for example, a backside surface thereof opposite to the conductive pad 130. The body part 254 passes through the substrate 110 and extends into the dielectric layer 120 directly on the protrusion part 256. The spike part 252 is formed passing through the dielectric layer 120 and the conductive pad 130 directly on the body part 254 and being connected to a conductive pad 130. The spike part 252 may protrude upwardly from the conductive pad 130. In some embodiments, a top portion of the spike part 252 may be aligned with a top portion of the conductive pad 130. The via electrode 250 may be formed in a single body such that spike part 252, body part 254 and protrusion part 254 are connected to each other. The body part 254 and the spike part 252 are electrically insulated from the substrate 110, the dielectric layer 120 and the conductive pad 130 by spacer insulation layer 240. The body part 254 may be formed only in the substrate 110 or only in the dielectric layer 120. The protrusion part 154 may be omitted.

Figure 23:
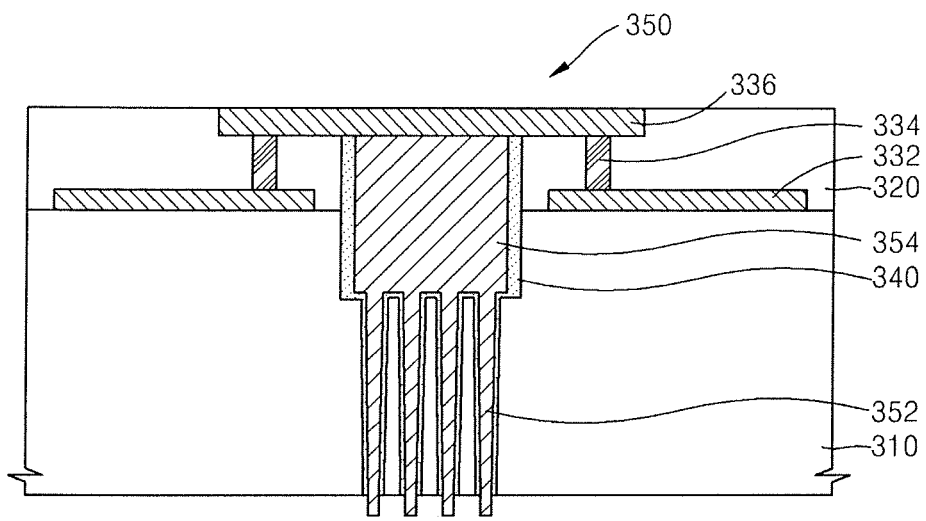
FIG. 23 is a cross sectional view showing an interposer device according to an exemplary embodiment.

FIG. 23 is a cross sectional view showing an interposer device according to an exemplary embodiment.

Referring to FIG. 23, a substrate 310 is provided. A first wiring pattern 332 is provided on the substrate 310. A second wiring pattern 336 is provided on the first wiring pattern 332. The second wiring pattern 336 is connected to the first wiring pattern 332 through conductive plugs 334 passing through a dielectric layer 320. At least one via electrode 350 is provided to extend through the semiconductor substrate vertically and is electrically connected to the second wiring pattern 336. A spacer insulation layer 340 is provided between the via electrode 350 and the substrate 310. The via electrode 350 includes a body part 354 and a spike part 352. The body part 354 passes through the dielectric layer 320 directly under the second wiring pattern 336 and extends into the substrate 310. The spike part 352 passes through the substrate 310 directly under the body part 354. The body part 354 and the spike part 352 are electrically connected each other.

Figure 24:
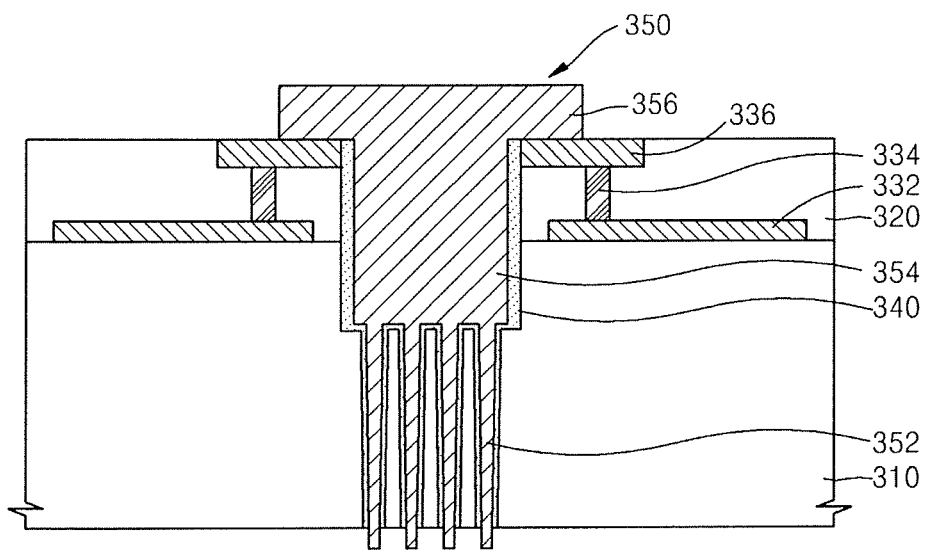
FIG. 24 is a cross sectional view showing an interposer device according to another exemplary embodiment.

The interposer device could be interposed between stacked chips, between stacked packages or between stacked chip and package to electrically connect chip to chip, package to package or chip to package. FIG. 24 is a cross sectional view showing an interposer device according to another exemplary embodiment. The interposer device is similar to the interposer device of FIG. 23 and thus repeated explanations are omitted.

Referring to FIG. 24, the via electrode 350 includes a body part 354, a protrusion part 356 and a spike part 352. The body part 354 passes through the dielectric layer 320 and the conductive pad 332 directly under the protrusion part 356 and extends into the substrate 310.

In accordance with exemplary embodiments of the present invention, when a chip is connected to other device, a spike part of the chip is firmly combined with the device penetrating into a portion of the device. In the case of chip stack module, the chips are firmly combined with each other by a penetration of the spike part into a conductive bump. As such, a void generation in a via electrode is prevented and connection reliability may be improved.

Although the present invention has been described in connection with exemplary embodiments illustrated in the accompanying drawings, it is not limited thereto. Persons with skill in the art will recognize that embodiments of the present invention may be applied to other types of memory devices. The above-disclosed subject matter is to be considered illustrative, and not restrictive, and the appended claims are intended to cover all such modifications, enhancements, and other embodiments, which fall within the true spirit and scope of the present invention.

What is claimed is:

1. A stack module, comprising:
a module substrate;
a first semiconductor chip and a second semiconductor chip sequentially stacked on the module substrate; and
a first conductive bump disposed between the first semiconductor chip and the second semiconductor chip,
wherein each of the first and second semiconductor chips comprises:
a semiconductor substrate;
a conductive pad disposed on the semiconductor substrate;
a via electrode connected to the conductive pad,
wherein the via electrode comprises:
a body portion that extends into the semiconductor substrate, and
a plurality of spikes located under the body portion that extend from the body portion into the semiconductor substrate,
wherein the spikes are spaced apart from one another and wherein the spikes have a tapered structure such that the spikes become narrower in diameter as they extend further away from the conductive pad;
a spacer insulation layer formed on the body portion and on the spikes of the via electrode,
wherein the spikes of the via electrode of one of the first semiconductor chip or the second semiconductor chip penetrate into the first conductive bump disposed between the first semiconductor chip and the second semiconductor chip.

2. The stack module of claim 1, wherein the spikes of the via electrode of the second semiconductor chip penetrate into the first conductive bump disposed between the first and second semiconductor chips, and wherein a portion of the spikes of the first semiconductor chip protrude through a backside of the semiconductor substrate of the first semiconductor chip.

3. The stack module of claim 1, further comprising:
an adhesive disposed between the first and second semiconductor chips,
a solder ball disposed on a backside of the module substrate opposite to a front side of the module substrate on which the first and second semiconductor chips are disposed; and
a second conductive bump disposed on the front side of the module substrate below the semiconductor substrate of the first semiconductor chip,
wherein the spikes of the via electrode of the second semiconductor chip penetrate into the first conductive bump disposed between the first and second semiconductor chips and wherein the spikes of the via electrode of the first semiconductor chip penetrate into the second conductive bump.

4. The stack module of claim 1, further comprising:
a second conductive bump disposed directly on a front side of the module substrate,
wherein the via electrode of the first semiconductor chip further includes a protrusion that extends beyond a surface of the conductive pad distal from the semiconductor substrate of the first semiconductor chip and is attached to the body part of the via electrode of the first semiconductor chip, wherein the spikes of the first semiconductor chip penetrate into the first conductive bump formed between the first and second semiconductor chips, and wherein the protrusion part of the via electrode of the first semiconductor chip faces the second conductive bump and is connected to the second conductive bump.

5. The stack module of claim 1, wherein the via electrodes of the first and second semiconductor chips are not aligned with each other along a vertical direction, wherein the first and second semiconductor chips have a different size than each other, wherein each of the first and second semiconductor chips has a redistribution line connected to the conductive pads on the semiconductor substrates of the first and second semiconductor chips, respectively and wherein the via electrode of the second semiconductor chip extends under the semiconductor substrate of the second semiconductor chip and is connected to the redistribution line of the first semiconductor chip through the first conductive bump disposed between the first and second semiconductor chips.

* * * * *